United States Patent
Misumi et al.

(10) Patent No.: US 11,506,978 B2
(45) Date of Patent: Nov. 22, 2022

(54) NEGATIVE TYPE PHOTOSENSITIVE COMPOSITION CURABLE AT LOW TEMPERATURE

(71) Applicant: AZ Electronic Materials (Luxembourg) S.a.r.l., Luxembourg (LU)

(72) Inventors: Motoki Misumi, Otsu (JP); Daishi Yokoyama, Kakegawa (JP); Katsuto Taniguchi, Kakegawa (JP); Masahiro Kuzawa, Nagoya (JP)

(73) Assignee: MERCK PATENT GMBH, Darmstadt (DE)

(*) Notice: Subject to any disclaimer, the term of this patent is extended or adjusted under 35 U.S.C. 154(b) by 502 days.

(21) Appl. No.: 16/089,021

(22) PCT Filed: Mar. 27, 2017

(86) PCT No.: PCT/EP2017/057195
§ 371 (c)(1),
(2) Date: Sep. 27, 2018

(87) PCT Pub. No.: WO2017/167690
PCT Pub. Date: Oct. 5, 2017

(65) Prior Publication Data
US 2020/0301277 A1   Sep. 24, 2020

(30) Foreign Application Priority Data

Mar. 30, 2016  (JP) ............... JP2016-069100

(51) Int. Cl.
| | |
|---|---|
| *G03F 7/075* | (2006.01) |
| *C08F 230/08* | (2006.01) |
| *C08G 77/14* | (2006.01) |
| *C08G 77/20* | (2006.01) |
| *G03F 7/00* | (2006.01) |
| *G03F 7/031* | (2006.01) |
| *G03F 7/32* | (2006.01) |
| *G03F 7/40* | (2006.01) |
| *G03F 7/16* | (2006.01) |
| *G03F 7/20* | (2006.01) |

(52) U.S. Cl.
CPC ........ *G03F 7/0757* (2013.01); *C08F 230/085* (2020.02); *C08G 77/14* (2013.01); *C08G 77/20* (2013.01); *G03F 7/0007* (2013.01); *G03F 7/031* (2013.01); *G03F 7/0758* (2013.01); *G03F 7/162* (2013.01); *G03F 7/168* (2013.01); *G03F 7/2004* (2013.01); *G03F 7/322* (2013.01); *G03F 7/40* (2013.01)

(58) Field of Classification Search
CPC ...... G03F 7/0758; G03F 7/0757; G03F 7/027; G03F 7/0047; G03F 7/0755
See application file for complete search history.

(56) References Cited

U.S. PATENT DOCUMENTS

| | | | |
|---|---|---|---|
| 9,690,197 B2 | 6/2017 | Araki et al. | |
| 2007/0172755 A1* | 7/2007 | Nakamura | G03F 7/023 |
| | | | 430/270.1 |
| 2013/0164869 A1* | 6/2013 | Ebe | C08K 5/56 |
| | | | 438/27 |
| 2014/0293400 A1* | 10/2014 | Tseng | G03F 7/0047 |
| | | | 359/296 |
| 2015/0031808 A1 | 1/2015 | Huang et al. | |
| 2015/0153646 A1 | 6/2015 | Hsieh et al. | |
| 2016/0161847 A1 | 6/2016 | Araki et al. | |

FOREIGN PATENT DOCUMENTS

| | | | |
|---|---|---|---|
| EP | 0226208 A2 | * | 6/1987 |
| JP | 2933879 B2 | | 8/1998 |
| JP | 2013174643 A | | 9/2013 |
| JP | 2014174374 A | | 9/2014 |
| JP | 2014189657 A | | 10/2014 |
| JP | 201518226 A | | 1/2015 |
| JP | 2015018226 A | * | 1/2015 |
| WO | WO-2015012228 A1 | | 1/2015 |

OTHER PUBLICATIONS

English Machine Translation of Yokoyama JP-2015018226-A (Jan. 2015) (Year: 2015).*
English Machine Translation of EP0226208A2 (Year: 1987).*
International Search Report for PCT/EP2017/057195 dated Jul. 7, 2017.
Written Opinion of the International Searching Authority for PCT/EP2017/057195 dated Jul. 7, 2017.

* cited by examiner

*Primary Examiner* — Peter L Vajda
*Assistant Examiner* — Nicholas E Brown
(74) *Attorney, Agent, or Firm* — Faegre Drinker Biddle & Reath LLP

(57) ABSTRACT

[Object] To provide a negative type photosensitive composition developable with a low concentration alkali developer and capable of forming a cured film excellent in transparency, in chemical resistance and in environmental durability; and further to provide a pattern-formation method employing the composition. [Means] The present invention provides a negative type photosensitive composition comprising: (I) an alkali-soluble resin, namely, a polymer comprising a carboxyl-containing polymerization unit and an alkoxysilyl-containing polymerization unit, (II) a polysiloxane, (III) a compound having two or more (meth) acryloyloxy groups, (IV) (i) a silicone derivative having a particular structure and/or (ii) a compound having two or more epoxy groups, (V) a polymerization initiator, and (VI) a solvent.

32 Claims, No Drawings

NEGATIVE TYPE PHOTOSENSITIVE COMPOSITION CURABLE AT LOW TEMPERATURE

CROSS-REFERENCE TO RELATED APPLICATIONS

This application is a national stage application (under 35 U.S.C. § 371) of PCT/EP2017/057195, filed Mar. 27, 2017, which claims benefit of Japanese Application No. 2016-069100, filed Mar. 30, 2016, both of which are incorporated herein by reference in their entirety.

TECHNICAL FIELD

The present invention relates to a negative type photosensitive composition. Further, this invention also relates to a cured film-producing method employing the composition, a cured film formed from the composition, and a device comprising the cured film.

BACKGROUND ART

In the field of optical devices, such as, displays, light emitting diodes and solar cells, various proposals have been recently made for the purposes of energy conservation and of improvement in light utilization efficiency. For example, there is a known method for increasing the aperture ratio of a liquid crystal display. In that method, a transparent planarization film is formed to cover a TFT element and then pixel electrodes are formed on the planarization film (see, Patent document 1).

It is also proposed to form a structure in which a touch panel is provided on an organic EL or on a liquid crystal module. Further, a flexible display, in which a plastic substrate is adopted in place of a glass one, is now attracting attention. In production processes of those devices, coating films are formed thereon preferably at such a low temperature that constituting elements of the devices may not be thermally damaged. Also in formation processes of coating films on other organic semiconductor devices or organic solar cells, the films are required to be cured at a low temperature in view of ecological preservation. However, for example, in the field of touch panel, reliability of the panel is tested on the basis of whether or not the panel can keep working normally at a certain voltage for a certain time under conditions of high temperature and high humidity. In view of that, common acrylic polymers are known to be often unable to provide enough durability to meet the demands of customers although capable of curing at a low temperature.

Patent document 2 discloses a negative type photosensitive composition comprising: an alkali-soluble resin, such as, a cardo resin; a multifunctional acrylic monomer; and a photo radical polymerization initiator mixed with a particular silane coupling agent. Working examples described in the document show that chemical resistance thereof depends on the kind of the resin.

Polysiloxane is known to have high heat resistance, but there is a case where a coating film thereof must be cured at a temperature of, for example, 200° C. or less according to the constituting elements of the device. In order to form a coating film having strong resistance against high temperature and high humidity, the coating film generally needs to be heated at 120° C. or more so that condensation reaction of silanol groups can proceed rapidly to be completed. Patent document 3 discloses a negative type photosensitive composition curable at a low temperature, and the composition comprises polysiloxane, an acrylic polymer and a polymerization initiator. When a coating film of that composition is exposed to light, the acrylic polymer having unsaturated bonds is photo-radical polymerized to form a cured film. However, some acrylic groups often remain unreacted after the film of the composition is cured at a low temperature, and hence there is a problem in that the unreacted acrylic groups react with chemicals employed in the production process of the device. Accordingly, it has been desired to develop a composition having both curability at a low temperature and strong chemical resistance. Further, in consideration of environmental burden, the composition is also wanted to be developable with a low concentration alkali developer other than organic one.

PRIOR ART DOCUMENTS

Patent Documents

[Patent document 1] Japanese Patent No. 2933879
[Patent document 2] Japanese Patent Laid-Open No. 2013-174643
[Patent document 3] Japanese Patent Laid-Open No. 2015-18226

DISCLOSURE OF INVENTION

Problem to be Solved by the Invention

The present invention is achieved in consideration of the above background, and hence aims to provide a negative type photosensitive composition developable with a low concentration alkali developer and also capable of forming, at a low temperature, a cured film or pattern excellent in transparency, in chemical resistance and in environmental durability.

Means for Solving Problem

The present invention provides a negative type photosensitive composition comprising:
(I) an alkali-soluble resin which is a polymer comprising a carboxyl-containing polymerization unit and an alkoxysilyl-containing polymerization unit,
(II) a polysiloxane,
(III) a compound having two or more (meth)acryloyloxy groups,
(IV) (i) a silicone derivative represented by the following formula (A):

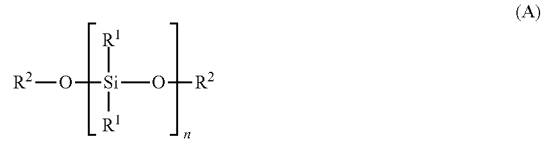

in which
each of $R^1$ and $R^2$ is independently a group selected from the group consisting of a straight, branched or cyclic alkyl group having 1 to 20 carbon atoms, an aryl group having 6 to 20 carbon atoms, epoxy group, (meth)acrylic group, mercapto group, carboxyl group, hydroxyl group, an alkoxy group, and isocyanurate group; provided that said alkyl or aryl group may be substituted with a group selected from the group consisting of epoxy group, (meth)acrylic group, mercapto group, carboxyl group, hydroxyl group, an alkoxy group, and isocyanurate group; and n is an integer of 1 to 20;

and/or (ii) a compound having two or more epoxy groups, (V) a polymerization initiator, and (VI) a solvent.

The present invention also provides a method for forming a cured film, comprising:

coating a substrate with the above composition, to form a coating film;

exposing the coating film to light; and developing the exposed film.

The present invention further provides a cured film formed from the above composition.

The present invention furthermore provides a device comprising the above cured film.

Effect of the Invention

The negative type photosensitive composition according to the present invention can be developed with a low concentration alkali developer and also can form a cured film or pattern of high optical transparency, of strong chemical resistance, and of tough environmental durability. In addition, the composition can be cured at a low temperature and does not need to be heated after exposure, and accordingly makes it possible to manufacture a cured film or pattern at low cost. The thus obtained cured film is also excellent in planarization and in electrical insulating properties, and hence can be favorably employed as a material for optical elements, such as, optical waveguides, as well as, as a material for various films, such as, planarization films on thin-film transistor (TFT) substrates, which are used as backplanes of displays such as LCD devices or organic EL devices; interlayer insulating films in semiconductor devices; and other insulating films or transparent protective films of solid state image sensors, of antireflection panels or films, of optical filters, of high brightness LED devices, of touch panels, and of solar cells.

BEST MODE FOR CARRYING OUT THE INVENTION

Negative Type Photosensitive Composition

The negative type photosensitive composition (hereinafter, often simply referred to as "composition") according to the present invention is characterized by comprising: (I) an alkali-soluble resin which is a polymer comprising a carboxyl-containing polymerization unit and an alkoxysilyl-containing polymerization unit, (II) a polysiloxane, (III) a compound having two or more (meth)acryloyloxy groups, (IV) a silicone derivative having a particular structure or a compound having two or more epoxy groups, (V) a polymerization initiator, and (VI) a solvent. Those ingredients contained in the composition of the present invention will be individually explained below in detail.

(I) Alkali-Soluble Resin

The composition according to the present invention contains an alkali-soluble resin which is a polymer comprising a carboxyl-containing polymerization unit and an alkoxysilyl-containing polymerization unit. There are no particular restrictions on the monomers constituting the polymer, but the polymer is preferably a copolymer obtained by polymerization of different monomers, such as, carboxyl-containing monomers and alkoxysilyl-containing ones.

The carboxyl-containing polymerization unit necessarily has a carboxyl group in the side chain, and is preferably derived from an unsaturated carboxylic acid, an unsaturated carboxylic anhydride, or a mixture thereof.

The alkoxysilyl-containing polymerization unit necessarily has an alkoxysilyl group in the side chain, and is preferably derived from a monomer represented by the following formula (B):

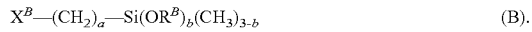

$$X^B-(CH_2)_a-Si(OR^B)_b(CH_3)_{3-b} \quad (B).$$

In the formula, $X^B$ is vinyl, styryl, or (meth)acryloyloxy group; $R^B$ is methyl or ethyl group; a is an integer of 0 to 3; and b is an integer of 1 to 3.

The above polymer preferably further comprises a hydroxyl-containing polymerization unit derived from a hydroxyl-containing unsaturated monomer.

There are no particular restrictions on the weight average molecular weight of the alkali-soluble resin according to the present invention, but it is preferably 1000 to 40000, more preferably 2000 to 30000. Here, the "weight average molecular weight" means a polystyrene-reduced weight average molecular weight determined by gel permission chromatography. The number of acid groups must be such a value that the composition can be developed with a low concentration alkali developer and also can have excellence in both reactivity and storage stability. In view of that, the solid content acid value is preferably 40 to 190 mg KOH/g, more preferably 60 to 150 mg KOH/g.

In the following description, the constituting units of the alkali-soluble resin will be individually explained.

(Carboxyl-Containing Polymerization Unit)

The carboxyl-containing polymerization unit fills the role of dissolving the polymer in an alkali developer. Examples of the unsaturated carboxylic acid for forming the carboxyl-containing polymerization unit include: (meth)acrylic acid, maleic acid, fumaric acid, crotonic acid, itaconic acid, citraconic acid, mesaconic acid, and cinnamic acid. Examples of the unsaturated carboxylic anhydride include: maleic acid anhydride, itaconic acid anhydride, citraconic acid anhydride, phthalic acid anhydride, tetrahydrophthalic acid anhydride, trimellic acid anhydride, and pyromellitic acid anhydride. It is also possible to use mixtures of those unsaturated carboxylic acids and unsaturated carboxylic anhydrides.

Among the above, (meth)acrylic acid is preferred. That is because (meth)acrylic acid enhances the solubility in the developer and consequently provides a pattern of good perpendicularity and high contrast. The content of the carboxyl-containing polymerization unit in the polymer is preferably 3 wt % or more so as to increase the solubility in the area where the alkali-soluble resin is intended to dissolve in the alkali developer, but preferably 50 wt % or less so as to surely keep the resin remaining in the area where the resin is intended not to dissolve. The carboxyl-containing polymerization unit is preferably contained in an amount of 5 to 30 wt %.

(Alkoxysilyl-Containing Polymerization Unit)

The alkoxysilyl-containing polymerization unit fills the role of forming a crosslinking structure in the polymer and enabling the cured film to have properties such as resistance against heat and chemicals. The monomer represented by the above formula (B), from which the alkoxysilyl-containing polymerization unit can be derived, is not particularly restricted as long as it has the structure of the formula (B). However, the integer b is preferably 2 or 3 because, if b is 1, the cured film tends to have too low crosslinking density to be sufficiently resistant to heat and chemicals.

Examples of the monomer include: 3-(meth)acryloyloxypropylmethyldimethoxysilane, 3-(meth)acryloyloxypropyltrimethoxysilane, 3-(meth)acryloyloxypropylmethyldiethoxysilane, 3-(meth)acryloyloxypropyltriethoxysilane, p-styryltrimethoxysilane, vinyltrimethoxysilane, vinyltriethoxysilane, vinyltriacetoxysilane, acrylic trimethoxysilane, and oligomerized or polymerized compounds thereof.

The content of the alkoxysilyl-containing polymerization unit in the polymer is preferably 1 wt % or more so that the cured film can have resistance to heat and chemicals, but preferably 50 wt % or less so as not to impair the storage stability. The alkoxysilyl-containing polymerization unit is particularly preferably contained in an amount of 5 to 30 wt %.

(Hydroxyl-Containing Polymerization Unit)

The hydroxyl-containing polymerization unit fills the role of forming a crosslinking structure to the polymer, which gives properties of mechanical strength and the like to the cured film This polymerization unit can be derived from a hydroxyl-containing unsaturated monomer, which is not particularly restricted as long as it contains a hydroxyl group. Examples of the hydroxyl-containing unsaturated monomer include: a hydroxyalkyl (meth)acrylate ester having an alkyl group of 1 to 16 carbon atoms, such as, 2-hydroxyethyl (meth)acrylate, 4-hydroxybutyl (meth)acrylate, 5-hydroxypentyl (meth)acrylate, 6-hydroxyhexyl (meth)acrylate, or 8-hydroxyoctyl (meth)acrylate; a caprolactone-modified monomer, such as, caprolactone-modified 2-hydroxyethyl (meth)acrylate; an oxyalkylene-modified monomer, such as, diethylene glycol (meth)acrylate, or polyethylene glycol (meth)acrylate; a primary hydroxyl-containing monomer, such as, 2-acryloyloxyethyl-2-hydroxyethylphthalic acid, N-methylol(meth)acrylamide, N-hydroxyethyl(meth)acrylamide, or 1,4-cyclohexanedimethanol monoacrylate; a secondary hydroxyl-containing monomer, such as, 2-hydroxypropyl (meth)acryalate, 2-hydroxybutyl (meth)acrylate, 2-hydroxypropyl-3-phenoxypropyl (meth)acrylate, or 3-chloro-2-hydroxypropyl (meth)acrylate; and a tertiary hydroxyl-containing monomer, such as, 2,2-dimethyl-2-hydroxyethyl (meth)acrylate.

Further, examples of compounds employable as the hydroxyl-containing unsaturated monomer include: a polyethylene glycol derivative, such as, diethylene glycol (meth)acrylate, or polyethylene glycol mono(meth)acrylate; a polypropylene glycol derivative, such as, polypropylene glycol mono(meth)acrylate; an oxyalkylene-modified monomer, such as, poly(ethylene glycol-polypropylene glycol) mono(meth)acrylate, poly(ethylene glycol-tetramethylene glycol) mono(meth)acrylate, or poly(polypropylene glycol-tetramethylene glycol) mono(meth)acrylate; and glycerol (meth)acrylate.

The content of the hydroxyl-containing polymerization unit in the polymer is preferably 1 wt % or more so that the cured film can have the properties of mechanical strength and the like, but preferably 40 wt % or less so as not to impair the storage stability. The hydroxyl-containing polymerization unit is particularly preferably contained in an amount of 5 to 35 wt %.

(Other Polymerization Units)

Other polymerization units can be also included so as to form the main skeleton of the polymer and to give properties of mechanical strength and the like to the cured film. Those polymerization units are derived from copolymerizable monomers, which are not particularly limited. Examples of the copolymerizable monomers include: aromatic vinyl compounds, such as, styrene, a-methylstyrene, tert-butylstyrene, o-vinyltoluene, m-vinyltoluene, p-vinyltoluene, p-chlorotoluene, o-methoxystyrene, m-methoxystyrene, p-methoxystyrene, o-vinylbenzyl methyl ether, m-vinylbenzyl methyl ether, p-vinylbenzyl methyl ether, o-vinylbenzyl glycidyl ether, m-vinylbenzyl glycidyl ether, and p-vinylbenzyl glycidyl ether; and unsaturated carboxylic acid esters, such as, methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, t-butyl (meth)acrylate, 2-ethylhexyl (meth)acrylate, octyl (meth)acrylate, n-nonyl (meth)acrylate, i-nonyl (meth)acrylate, n-decyl (meth)acrylate, i-decyl (meth)acrylate, lauryl (meth)acrylate, tridecyl (meth)acrylate, cetyl (meth)acrylate, n-stearyl (meth)acrylate, i-stearyl (meth)acrylate, behenyl (meth)acrylate, cyclohexyl (meth)acrylate, phenyl (meth)acrylate, tetrahydrofurfuryl (meth)acrylate, isobornyl (meth)acrylate, 2-methyl-2-adamantyl (meth)acrylate, 2-ethyl-2-adamantyl (meth)acrylate, 2-isopropyl-2-adamantyl (meth)acrylate, 2-methoxyethyl (meth)acrylate, 2-phenoxyethyl (meth)acrylate, diethylene glycol monomethyl ether (meth)acrylate, triethylene glycol monomethyl ether (meth)acrylate, propylene glycol monomethyl ether (meth)acrylate, dipropylene glycol monomethyl ether (meth)acrylate, isobornyl (meth)acrylate, 2-hydroxy-3-phenoxypropyl (meth)acrylate, 2-aminoethyl (meth)acrylate, 2-dimethylaminoethyl (meth)acrylate, 2-aminopropyl (meth)acrylate, 2-dimethylaminopropyl (meth)acrylate, 3-aminopropyl (meth)acrylate, 3-dimethylaminopropyl (meth)acrylate, glycidyl (meth)acrylate, 2,2,2-trifluoroethyl (meth)acrylate, 2,2,3,3-tetrafluoropropyl (meth)acrylate, 2,2,3,3,3-pentafluoropropyl (meth)acrylate, 2,2,3,4,4,4-hexafluorobutyl (meth)acrylate, 2-(perfluorobutyl)ethyl (meth)acrylate, 3-perfluorobutyl-2-hydroxypropyl (meth)acrylate, 2-(perfluorohexyl)ethyl (meth)acrylate, 3-perfluorohexyl-2-hydroxyl-propyl (meth)acrylate, 1H,1H,3H-tetrafluoropropyl (meth)acrylate, 1H,1H,5H-octafluoropentyl (meth)acrylate, 1H,1H,7H-dodecafluoroheptyl (meth)acrylate, and perfluorooctylethyl (meth)acrylate.

The content of other polymerization units in the polymer is preferably 40 wt % or more so that the cured film can have the properties of mechanical strength and the like, but preferably 90 wt % or less so that the polymer can surely contain the indispensable constituents.

There are no particular restrictions on the blend ratio between the polysiloxane and the alkali-soluble resin. However, the alkali-soluble resin is preferably blended in a relatively large amount if the coating film is intended to be formed thick, but on the other hand the polysiloxane is preferably blended in a relatively large amount in view of the transparency and the chemical resistance, particularly, when the composition is intended to be used in a process at a high temperature. Accordingly, the blend ratio between the polysiloxane and the alkali-soluble resin is preferably 10:90 to 70:30, more preferably 20:80 to 50:50.

(II) Polysiloxane

The composition according to the present invention contains a polysiloxane as a main ingredient. The term "polysiloxane" means a polymer having Si—O—Si bonds, and it means not only an unsubstituted inorganic polysiloxane but also an organic group-substituted organic polysiloxane in the present invention. The polysiloxane compound generally has silanol groups or alkoxysilyl groups. The terms "silanol groups" and "alkoxysilyl groups" mean hydroxyl groups and alkoxy groups, respectively, which directly connect to silicon atoms constituting the siloxane skeleton. Those groups have a function of promoting a curing reaction when a cured film is formed from the composition, and they are also thought to contribute to the reaction with the later-described silane coupling agent. Accordingly, the polysiloxane preferably has those groups.

The polysiloxane used in the present invention is not particularly restricted on its structure, and can be freely selected in accordance with the aimed applications. According to the number of oxygen atoms connecting to a silicon atom, the structure of polysiloxane can be generally categorized into the following three skeletons, that is: silicone skeleton (in which two oxygen atoms connect to a silicon atom), silsesquioxane skeleton (in which three oxygen atoms connect to a silicon atom), and silica skeleton (in which four oxygen atoms connect to a silicon atom). In the present invention, the polysiloxane may have any of those skeletons. Further, the polysiloxane molecule may contain two or more of them in combination.

In the case where an organic polysiloxane is adopted, substituent groups contained therein can be freely selected unless they impair the effect of the present invention. The substituent groups are, for example, groups having no Si—O bonds, which constitute the siloxane structure. Examples thereof include alkyl groups, hydroxyalkyl groups, aryl groups, and groups in which hydrogen atoms in those groups are substituted with unsaturated hydrocarbon groups.

The siloxane resin may have reactive groups other than the silanol or alkoxysilyl groups, such as, carboxyl groups, sulfonyl groups, and amino groups, unless they impair the effect of the present invention. However, those reactive groups generally tend to lower the storage stability of the composition, and hence they are preferably contained in a small amount. Specifically, the amount thereof is preferably 10 mol % or less based on the total number of hydrogen atoms or substituent groups connecting to silicon atoms. Further, those reactive groups are particularly preferably not contained at all It is for the purpose of forming a cured film that the composition of the present invention is coated on a substrate, imagewise exposed to light and then developed. This means that there must be a difference in solubility between the exposed area and the unexposed area. In the present invention, the exposed area undergoes a curing reaction to be insoluble in a developer and thereby to form an image. Accordingly, the film in the unexposed area should be soluble in a developer more than a certain degree. If developed with a tetramethylammonium hydroxide (hereinafter often referred to as "TMAH") aqueous solution in as low a concentration as 1% or less, the polysiloxane having silanol or alkoxysilyl groups forms a surface hardly-soluble layer and hence it is difficult to measure the dissolution rate of the film formed from the composition. Because of that, the dissolution rate is preferably based on the measurement with a 2.38% TMAH aqueous solution. If the coating film after prebaked has a dissolution rate of 50 Å/second or more in a 2.38% TMAH aqueous solution, it is thought to be possible to produce a negative type pattern by exposure-development procedures. In the present invention, the polysiloxane is thus evaluated on the basis of the dissolution rate in a 2.38% TMAH aqueous solution. However, the required solubility depends on the thickness of the film and the development conditions, and hence the polysiloxane and the alkali-soluble resin must be properly selected according to the development conditions. For example, if the film has a thickness of 0.1 to 10 μm (1000 to 100000 Å), the dissolution rate in an adopted developer is preferably 50 to 5000 Å/second although it varies according to the kind and amount of the photosensitive agent contained in the composition.

The polysiloxane can be produced in a manner where a silane compound is hydrolyzed in the presence of an acidic or basic catalyst and then condensed.

Any silane compound can be employed as a starting material. For example, it can be represented by the following formula (i):

$$R^{i1}_n Si(OR^{i2})_{4-n} \quad (i)$$

in which $R^{i1}$ is hydrogen, a straight, branched or cyclic alkyl group or alkenyl group of 1 to 20 carbon atoms or otherwise is an aryl group of 6 to 20 carbon atoms in which one or more methylene may be replaced with oxygen or one or more hydrogen may be replaced with fluorine, an acrylic group or epoxy group; $R^{i2}$ is hydrogen or an alkyl group of 1 to 10 carbon atoms, preferably, an alkyl group of 1 to 6 carbon atoms; and n is an integer of 0 to 2.

Examples of $R^{i1}$ in the formula (i) include methyl, ethyl, n-propyl, iso-propyl, t-butyl, n-hexyl, n-decyl, trifluoromethyl, 2,2,2-trifluoroethyl, 3,3,3-trifluoropropyl, cyclohexyl, phenyl, and tolyl groups. The compound having methyl group as $R^{i1}$ is particularly preferred because that material is easily available and further because the resultant cured film has sufficient hardness and high chemical resistance. Also preferred is a phenyl group because it enhances solubility of the polysiloxane in the solvent and makes the resultant cured film hardly suffer from cracking. Further, $R^{i1}$ is still also preferably an acrylic or epoxy group because they enhance the crosslinking density among the resins and between the resins and the crosslinking agent and thereby contribute toward formation of a dense and uniform film.

Examples of $R^{i2}$ in the formula (i) include methyl, ethyl, n-propyl, iso-propyl, and n-butyl groups. The formula (i) has two or more $R^{i2}$s, which may be the same as or different from each other.

Concrete examples of the trialkoxysilane compounds represented by the formula (i) include: methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, trifluoromethyltrimethoxysilane, trifluoromethyltriethoxysilane, 3,3,3-trifluoropropyltrimethoxysilane, 3-methacryloxypropyltriethoxysilane, 3-methacryloxypropyltrimethoxysilane, 2-(3,4-epoxycyclohexyl)ethyltrimethoxysilane, 3-glycidoxypropyltrimethoxysilane, and 3-glycidoxypropyltriethoxysilane. Among them, preferred are methyltrimethoxysilane, methyltriethoxysilane, phenyltrimethoxysilane, phenyltriethoxysilane, 3-glycidoxypropyltrimethoxysilane and 3-methacryloxypropyltrimethoxysilane because they are easily available.

Further, concrete examples of the tetraalkoxysilane compounds represented by the formula (i) include tetramethoxysilane, tetraethoxysilane, tetrapropoxysilane, and tetrabutoxysilane. Among them, preferred are tetramethoxysilane and tetraethoxysilane because they have high reactivity.

Furthermore, concrete examples of the dialkoxysilane compounds represented by the formula (i) include: dimethoxysilane, diethoxysilane, dipropoxysilane, dibutoxysilane, dimethoxydimethylsilane, diethoxydimethylsilane, 3-(2-aminoethylamino)propyldimethoxymethylsilane, 3-aminopropyldiethoxymethylsilane, 3-aminopropyldimethoxymethylsilane, (3-chloropropyl)diethoxy(methyl)silane, (3-chloropropyl)dimethoxy(methyl)silane, cyclohexyl (dimethoxy)methylsilane, dicyclopentyl(dimethoxy)silane, diethoxydimethylsilane, diethoxydiphenylsilane, diethoxy(3-glycidyloxypropyl)methylsilane, diethoxy(methyl)phenylsilane, diethoxymethylsilane, diethoxymethylvinylsilane, diisobutyldiemthoxysilane, dimethoxydimethylsilane, dimethoxydiphenylsilane, dimethoxydi-p-tosylsilane, dimethoxymethylphenylsilane, dimethoxy(methyl)silane, dimethoxymethylvinylsilane, and 3-mercaptopropyl(dimethoxy)methylsilane. Among them, preferred are dimethoxydimethylsilane, diethoxydimethylsilane, diethoxydiphenylsilane, diethoxy(methyl)phenylsilane, diethoxymethylsilane, diethoxymethylvinylsilane, dimethoxydimethylsilane, dimethoxydiphenylsilane, dimethoxymethylphenylsilane and dimethoxymethylvinylsilane.

For synthesis of the polysiloxane, the silane compound may be used singly or in combination of two or more kinds thereof. If it is necessary to increase the crosslinking density, a tetraalkoxysilane can be adopted in combination with other silane compounds. In that case, the amount of tetraalkoxysilane is preferably 0.1 to 40 mol %, more preferably 1 to 30 mol %, based on the total molar amount of the alkoxysilane compounds.

The starting material of the polysiloxane may be a trialkoxysilane and/or a tetraalkoxysilane in combination with, if necessary, a dialkoxysilane. However, if the composition is intended to be used in a process at a high temperature, the amount of the dialkoxysilane is preferably 70 mol % or less, more preferably 40 mol % or less, based on the total molar amount of the silane compounds.

The polysiloxane can be produced, for example, by the steps of: dropping the silane compound or a mixture thereof into a reaction solvent comprising an organic solvent, a basic catalyst and water, so as to conduct hydrolysis and condensation reactions; neutralizing, purifying by washing or condensing the reaction solution, if necessary; and replacing the reaction solvent with a desired organic solvent, if necessary.

Examples of the organic solvent adoptable as the reaction solvent include: hydrocarbons, such as, hexane, toluene, xylene and benzene; ethers, such as, diethyl ether and tetrahydrofuran; esters, such as, ethyl acetate and propylene glycol monomethylethylacetate; alcohols, such as, methanol, ethanol, iso-propanol, butanol and 1,3-dipropanol; and ketones, such as, acetone, methyl ethyl ketone and methyl isobutyl ketone. Those organic solvents can be employed singly or in combination. The amount of the organic solvent is generally 0.1 to 10 times by weight, preferably 0.5 to 2 times by weight of the mixture of the silane compounds.

The temperature at which the hydrolysis and condensation reactions are conducted is generally 0 to 200° C., preferably 10 to 60° C. The temperature of the dropped silane compound may be the same as or different from that of the reaction solvent. The reaction time depends on the kind of the silane compound and the like, but is normally several tens of minutes to several tens of hours, preferably 30 minutes or more. Various conditions of the hydrolysis and condensation reactions, such as, the amount of the basic catalyst, the reaction temperature and the reaction time, are properly selected in consideration of the reaction scale and the size and shape of the reaction vessel, so as to obtain properties suitable for the aimed use.

Examples of the basic catalyst include: organic bases, such as, triethylamine, tripropylamine, tributylamine, tripentylamine, trihexylamine, triheptylamine, trioctylamine, diethylamine, triethanolamine, diethanolamine, and alkoxysilane having amino group; inorganic bases, such as, sodium hydroxide and potassium hydroxide; anion exchange resin; and tertiary ammonium salts, such as, tetrabutylammonium hydroxide, tetraethylammonium hydroxide, tetramethylammonium hydroxide and choline. The amount of the catalyst is preferably 0.0001 to 10 times by mole of the mixture of the silane compounds. The polysiloxane synthesized by use of the basic catalyst is characterized in that it rapidly begins to cure when heated at 150° C. or more and also in that the pattern thereof can keep the shape clearly even after curing without suffering from pattern collapsing.

The degree of the hydrolysis can be controlled by how much water is added to the reaction solvent. It is generally preferred to make water react with hydrolytic alkoxy groups in the silane compound in an amount of 0.01 to 10 times by mole, preferably 0.1 to 5 times by mole of the groups. If the added amount of water is smaller than the above, the hydrolysis degree is too low to form a coating film of the composition. That is unfavorable. On the other hand, however, if it is too much, the composition easily undergoes gelation and hence has low storage stability. That is unfavorable, too. The water is preferably ion exchange water or distilled water.

After the reactions are completed, the reaction solution may be made neutral or weakly acidic by use of an acidic compound as a neutralizer. Examples of the acidic compound include: inorganic acids, such as, phosphoric acid, nitric acid, sulfuric acid, hydrochloric acid and hydrofluoric acid; and organic acids, such as, acetic acid, trifluoroacetic acid, formic acid, lactic acid, acrylic acid, multivalent carboxylic acids (e.g., oxalic acid, maleic acid, succinic acid, citric acid) and anhydrides thereof, and sulfonic acids (e.g., p-toluenesulfonic acid and methanesulfonic acid). Further, cation exchange resin can be used as a neutralizer.

The amount of the neutralizer is properly selected according to pH of the reaction solution after the reactions, but is preferably 0.5 to 1.5 times by mole, more preferably 1 to 1.1 times by mole of the basic catalyst. In the case where cation exchange resin is adopted, the number of ionic groups in the exchange resin is preferably in the above range.

According to necessity, the reaction solution after neutralized can be washed and purified. There are no particular restrictions on the way of washing. For example, hydrophobic organic solvent and water, if necessary, are added to the reaction solution after neutralized, and then the mixture was stirred and thereby the organic solvent is brought into contact with the polysiloxane so as to dissolve at least the polysiloxane in the hydrophobic organic solvent phase. As the hydrophobic organic solvent, a compound capable of dissolving the polysiloxane but immiscible with water is employed. Here, the compound "immiscible with water" means that, even if water and the compound are well mixed, the mixture separates into an aqueous phase and an organic phase while left to stand.

Preferred examples of the hydrophobic organic solvent include: ethers, such as, diethyl ether; esters, such as, ethyl acetate; alcohols having low solubility in water, such as, butanol; ketones, such as, methyl ethyl ketone and methyl isobutyl ketone; and aromatic solvents, such as, toluene and xylene. The hydrophobic organic solvent used in washing may be the same as or different from the organic solvent used as the reaction solvent, and further two or more solvents may be mixed to use. In this washing step, most of the basic catalyst used in the reactions, the neutralizer, salts formed by the neutralization, and by-products of the reactions, such as, alcohols and water, are contained in the aqueous phase and hence essentially removed from the organic phase. The times of washing can be changed according to necessity.

The temperature in washing is not particularly restricted, but is preferably 0 to 70° C., more preferably 10 to 60° C. The temperature at which the aqueous phase and the organic phase are separated is also not particularly restricted, but is preferably 0 to 70° C., more preferably 10 to 60° C. in view of shorting the time for separating the phases.

The above washing step may improve the composition in coating properties and in storage stability.

The reaction solution after washed may be directly added to the composition of the present invention, but can be condensed, if necessary, to remove the solvent and remaining by-products, such as, alcohols and water, and thereby to change the concentration. Further, the solvent may be replaced with another solvent. The solution can be condensed under normal (atmospheric) pressure or reduced pressure, and the degree of condensation can be freely changed by controlling the distilled amount. The temperature in the condensation step is generally 30 to 150° C., preferably 40 to 100° C. According to the aimed solvent composition, a desired solvent may be added and then the solution may be further condensed to replace the solvent.

In producing the polysiloxane, an acidic catalyst can be used as the reaction catalyst. Examples of the acidic catalyst include hydrochloric acid, nitric acid, sulfuric acid, hydrofluoric acid, phosphoric acid, acetic acid, trifluoroacetic acid, formic acid, and multivalent carboxylic acids and anhydrides thereof. The amount of the catalyst depends on the strength of the acid, but is preferably 0.0001 to 10 times by mole of the mixture of the silane compounds.

In the case where the acidic catalyst is adopted to produce the polysiloxane, the reaction solution may be neutralized after the reactions are completed in the same manner as in the case where the basic catalyst is adopted. In this case, however, basic compounds are employed as the neutralizer. Examples of the basic compounds used for neutralization include: organic bases, such as, triethylamine, tripropylamine, tributylamine, tripentylamine, trihexylamine, triheptylamine, trioctylamine, diethylamine, triethanolamine, and diethanolamine; inorganic bases, such as, sodium hydroxide and potassium hydroxide; and tertiary ammonium salts, such as, tetrabutylammonium hydroxide, tetraethylammonium hydroxide, and tetramethylammonium hydroxide. In addition, anion exchange resin is also employable. The amount of the neutralizer may be the same as that in the case where the basic catalyst is adopted. Specifically, that is properly selected according to pH of the reaction solution after the reactions, but is preferably 0.5 to 1.5 times by mole, more preferably to 1.1 times by mole of the acidic catalyst.

In the above manner, the polysiloxane usable in the composition of the present invention can be produced.

The polysiloxane has a weight average molecular weight of preferably 700 to 5000, more preferably 1000 to 4000. If a mixture of the polysiloxanes is employed, each polysiloxane has a weight average molecular weight of 5000 or less. Here, the "weight average molecular weight" means a polystyrene-reduced weight average molecular weight determined by gel permission chromatography.

In the present invention, the polysiloxane has a specific dissolution rate in a TMAH aqueous solution. The dissolution rate of polysiloxane in a TMAH aqueous solution is measured in the following manner. First, the polysiloxane is diluted with propyleneglycol monomethyletheracetate (hereinafter, referred to as "PGMEA") to be 35 wt %, and stirred and dissolved with a stirrer for 1 hour at room temperature. In a clean-room under an atmosphere of temperature: 23.0±0.5° C. and humidity: 50±5.0%, the prepared polysiloxane solution is then dropped with a pipet in an amount of 1 cc onto a 4-inch silicon wafer of 525 μm thickness at the center area, and spin-coated to form a coating of 2±0.1 μm thickness. Thereafter, the coating is pre-baked for 90 seconds on a hot-plate at 100° C. to remove the solvent. The thickness of the coating is then measured with a spectro-ellipsometer (manufactured by J. A. Woollam).

Subsequently, the silicon wafer covered with the coating is placed in a 6 inch-diameter glass petri dish filled with 100 ml of a 2.38% TMAH aqueous solution at 23.0±0.1° C., and left to be immersed. The time it takes for the coating to disappear is measured. The dissolution rate is obtained by dividing the initial thickness of the coating by the time it takes for the coating to dissolve and disappear in the area from the wafer edge to 10-mm inside. Otherwise, in the case where the dissolution rate is extremely slow, the wafer is immersed in the TMAH aqueous solution for a predetermined time and then heated for 5 minutes on a hot-plate at 200° C. to remove water soaked in the coating during the measurement of dissolution rate, and thereafter the thickness of the coating is measured. The thickness change between before and after the immersion is divided by the immersing time to obtain the dissolution rate. The measurement is repeated five times and the obtained values are averaged to determine the dissolution rate of the polysiloxane.

(III) Compound Having Two or More (Meth)Acryloyloxy Groups

The composition according to the present invention contains a compound having two or more (meth)acryloyloxy groups (hereinafter, often referred to as "(meth)acryloyloxy-containing compound" or "acrylic monomer" for simplification).

Here, the "(meth)acryloyloxy group" generally means an acryloyloxy or methacryloyloxy group. This compound can react with the above polysiloxane and the above alkali-soluble resin to form a crosslinking structure. In order to form a crosslinking structure, the compound necessarily has two or more acryloyloxy or methacryloyloxy groups. The compound preferably has three or more acryloyloxy or methacryloyloxy groups for the purpose of forming a sufficient crosslinking structure.

As the compound having two or more (meth)acryloyloxy groups, it is preferred to adopt an ester obtained by reaction between (α) a polyol compound having two or more hydroxyl groups and (β) two or more (meth)acrylic acids. The polyol compound (α) is, for example, a compound whose basic skeleton is a saturated or unsaturated aliphatic hydrocarbon, an aromatic hydrocarbon, a heterocyclic hydrocarbon, a primary, secondary or tertiary amine, or an ether and also which has two or more hydroxyl groups as substituents. The polyol compound may have other substituents, such as, carboxyl group, carbonyl group, amino group, ether bond, thiol group, and thioether bond as long as they do not impair the effect of the present invention.

Preferred examples of the polyol compound include: alkyl polyols, aryl polyols, polyalkanol amines, cyanuric acid, and dipentaerythritol. If the polyol compound (α) has three or more hydroxyl groups, it is unnecessary for all the hydroxyl groups to react with (meth)acrylic acids and hence the compound may be partly esterified. In other words, the ester may have unreacted hydroxyl groups. Examples of that ester include: tris(2-acryloxyethyl) isocyanurate, dipentaerythritol hexa(meth)acrylate, tripentaerythritol octa(meth)acrylate, pentaerythritol tetra(meth)acrylate, dipropyleneglycol diacrylate, tripropyleneglycol diacrylate, trimethylolpropane triacrylate, polytetramethyleneglycol dimethacrylate, trimethylolpropane trimethacrylate, ditrimethylolpropane tetraacrylate, tricyclodecanedimethanol diacrylate, 1.9-nonanediol diacrylate, 1,6-hexanediol diacrylate, 1,10-decanediol diacrylate, and bis(acryloyloxymethyl)tricyclo[5.2.1.0$^{2,6}$]decane. Among the above, tris(2-acryloxyethyl) isocyanurate, bis(acryloyloxymethyl)tricyclo[5.2.1.0$^{2,6}$] decane and dipentaerythritol hexaacrylate are preferred in view of the reactivity and the number of crosslinkable groups. Those compounds may be used in combination of two or more thereof so as to control the shape of the formed pattern. For example, it is possible to adopt a compound having three (meth)acryloyloxy groups in combination with one having two (meth)acryloyloxy groups.

In view of the reactivity, the above compound is preferably a molecule smaller than the polysiloxane or the alkali-soluble resin and hence has a molecular weight of preferably 2000 or less, more preferably 1500 or less.

The amount of the (meth)acryloyloxy-containing compound is controlled according to the adopted polymer and the kind of the compound, but is preferably 3 to 80 weight parts based on 100 weight parts in total of the polysiloxane and the alkali-soluble resin in consideration of the compatibility with the resins. The (meth)acryloyloxy-containing compound may be used singly or in combination of two or more kinds thereof.

(IV) Silicone Derivative Having Particular Structure, or Compound Having Two or More Epoxy Groups The composition according to the present invention contains either or both of a silicone derivative represented by the following formula (A) (hereinafter, often referred to as "silicone derivative" for simplification) and a compound having two or more epoxy groups.

(i) Silicone Derivative Having Particular Structure

The silicone derivative has a function of protecting the film surface, and hence is thought to play a role of protecting the film from chemicals used in post-treatments carried out after a pattern is formed, so as to prevent the pattern from being excessively eroded.

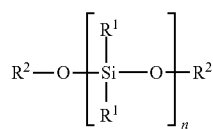

(A)

In the above formula, each of R$^1$ and R$^2$ is independently a group selected from the group consisting of a straight, branched or cyclic alkyl group having 1 to 20 carbon atoms, an aryl group having 6 to 20 carbon atoms, epoxy group, (meth)acrylic group, mercapto group, carboxyl group, hydroxyl group, an alkoxy group, and isocyanurate group; provided that said alkyl or aryl group may be substituted with a group selected from the group consisting of epoxy group, (meth)acrylic group, mercapto group, carboxyl group, hydroxyl group, an alkoxy group, and isocyanurate group; and n is an integer of 1 to 20.

Preferred examples of R$^1$ include: methyl, ethyl, phenyl, benzyl, epoxy, (meth)acrylic, mercapto, carboxyl, hydroxyl, acetyl, methoxymethyl, trimethoxysilyl, and isocyanurate groups. Particularly preferred are methyl, phenyl, epoxy and (meth)acrylic groups.

Preferred examples of R$^2$ are methyl and ethyl groups.

The silicone derivative is preferably synthesized from a monomer selected from the group consisting of diethoxy-diphenylsilane, diethoxy(methyl)phenylsilane, diethoxym-ethylsilane, diethoxymethylvinylsilane, dimethoxydimeth-ylsilane, dimethoxydiphenylsilane, dimethoxymethylphenylsilane and dimethoxymethylvinyl-silane.

If having too large a molecular weight, the silicone derivative has such poor compatibility with the polysiloxane that the composition containing a necessary amount of the derivative is often incapable of forming a uniform coating film. Further, that derivative may lower the solubility of the film in the developer to leave development residues. The weight average molecular weight of the derivative is hence preferably 5000 or less, more preferably 4000 or less. If the silicone derivative is an oligomer, it preferably has a weight average molecular weight of the oligomer is preferably 20000 or less, more preferably of 10000 or less.

(ii) Compound Having Two or More Epoxy Groups

There are no particular restrictions on the compound having two or more epoxy groups (hereinafter, often referred to as "epoxy-containing compound" for simplification). The epoxy group may be included in glycidyloxy, glycidy-lamino, glycidylester or the like group, and is preferably included in a glycidyloxy group. This means that the compound having two or more epoxy groups in the present invention is preferably a compound having two or more glycidyloxy groups. In order to form a crosslinking structure, the epoxy-containing compound of the present invention necessarily has two or more epoxy groups serving as the reactive groups. Further, the compound preferably has three or more epoxy groups for the purpose of forming a sufficient crosslinking structure. Furthermore, in view of improving the heat resistance, the compound preferably has a multivalent phenol skeleton. In addition, the epoxy-containing compound preferably has a weight average molecular weight of 700 or less. That is because the smaller the molecular weight is, the more the compatibility in the composition is improved and accordingly the more homogeneously the compound is dispersed therein.

In the present specification, the substances categorized into the above ingredient (III) are not included in the "epoxy-containing compound".

The epoxy-containing compound is not particularly restricted but is preferably represented by the following formula (C) or (D):

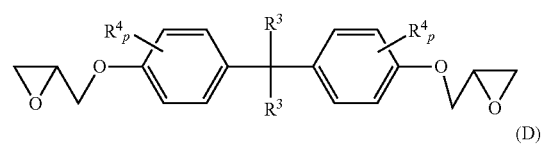

(C)

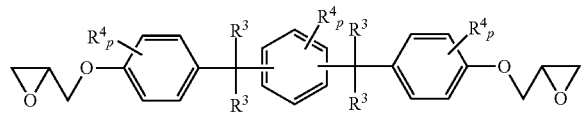

(D)

In the above formulas, each R$^3$ is independently an alkyl group, an aryl group, carboxy group, a fluorinated alkyl group, a carboxyalkyl group, a glycidyloxyaryl group, a glycidyloxyarylalkyl group or a glycidyloxyarylalkylaryl group, provided that two R$^3$s connecting to the same carbon atom may link to each other to form a cycloalkyl or condensed multicyclic hydrocarbon ring;

each $R^4$ is independently a glycidyloxyarylalkyl group or an alkyl group; and p is an integer of 0 to 4.

Preferably, $R^3$ is an alkyl group of 1 to 8 carbon atoms, an aryl group of 6 to 10 carbon atoms, carboxy group, a fluorinated alkyl group of 1 to 3 carbon atoms, a carboxyalkyl group of 2 to 4 carbon atoms, a glycidyloxyaryl group of 6 to 13 carbon atoms, a glycidyloxyarylalkyl group of 9 to 15 carbon atoms, or glycidyloxyarylalkylaryl group of 15 to 25 carbon atoms.

In the case where $R^3$s form a cycloalkyl ring, the ring preferably contains 6 to 8 carbon atoms. If forming a condensed multicyclic hydrocarbon ring, the ring preferably contains 10 to 15 carbon atoms. The cycloalkyl or condensed multicyclic hydrocarbon ring may be substituted with a group containing a glycidyloxyaryl group.

In the above formulas, $R^4$ is preferably a glycidyloxyarylalkyl group of 9 to 13 carbon atoms or an alkyl group of 1 to 8 carbon atoms.

The integer of p is preferably 0 to 2.

Preferred examples of the compound represented by the above formulas are as follows:

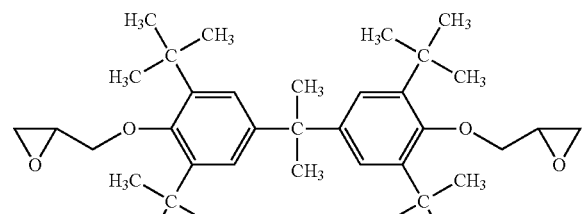
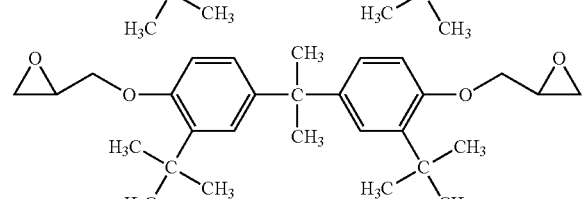
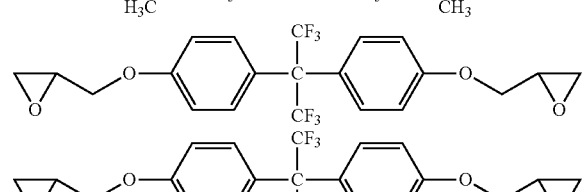
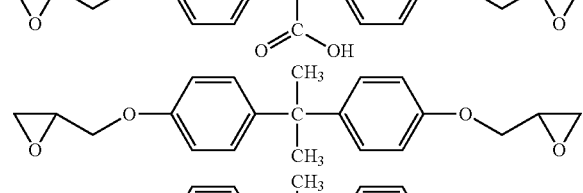
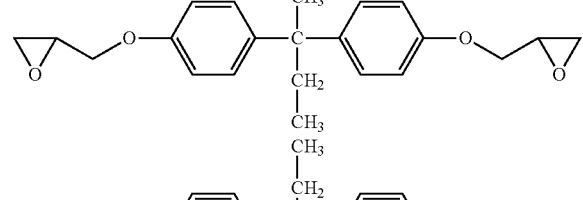
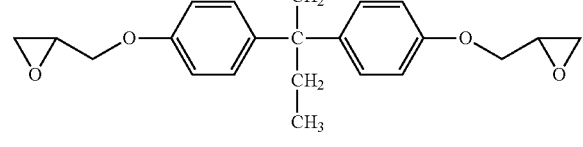

-continued

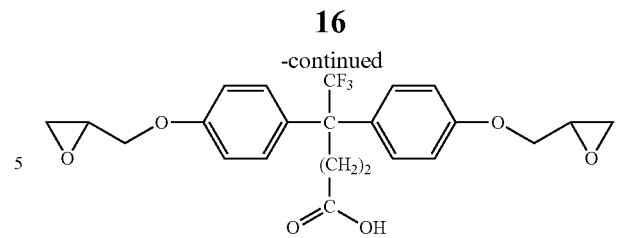
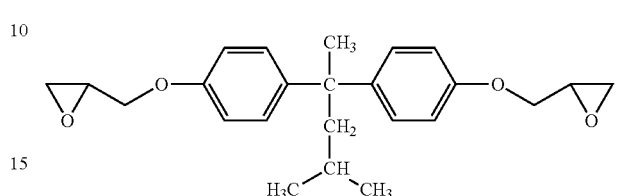
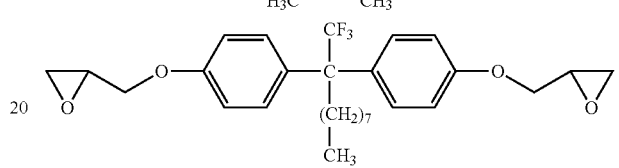
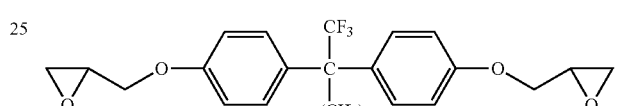
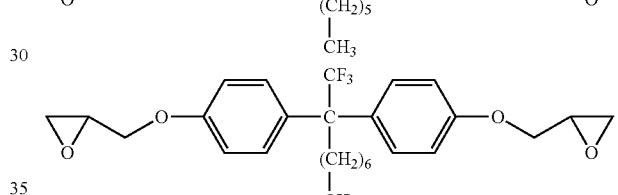
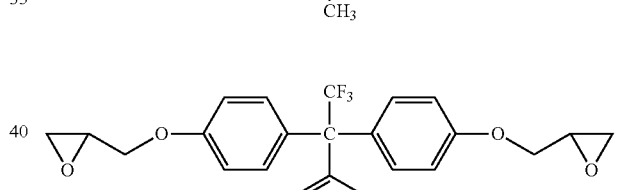
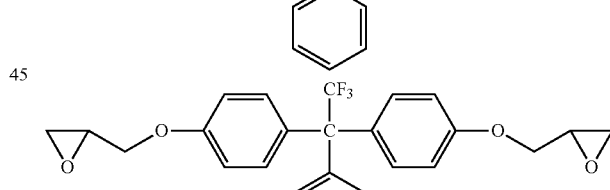
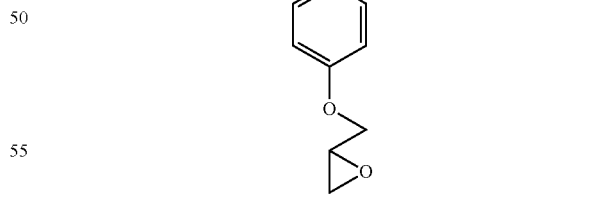
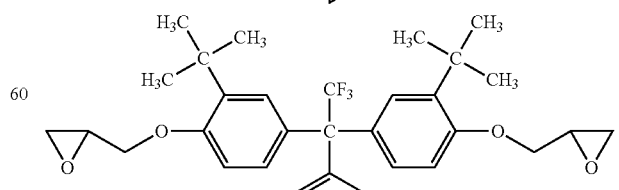

-continued

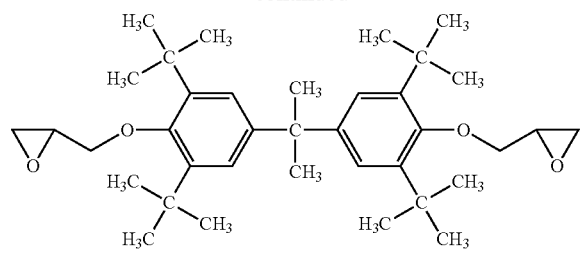
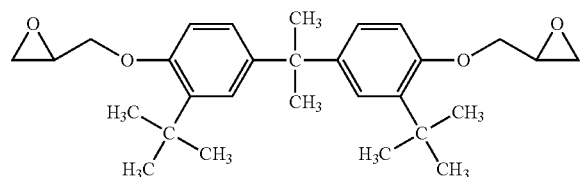
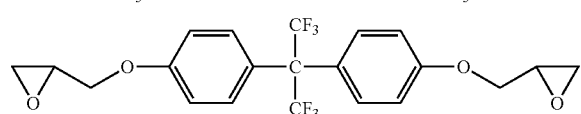
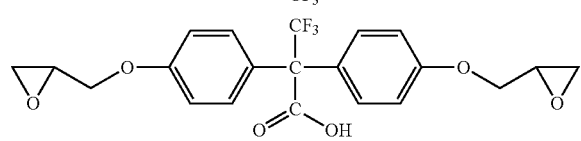
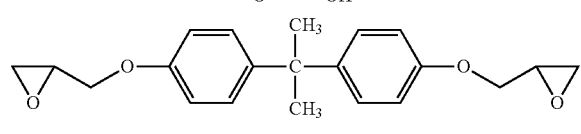
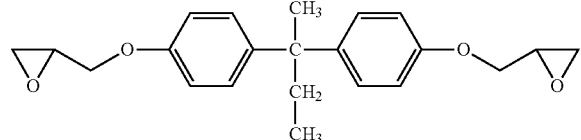
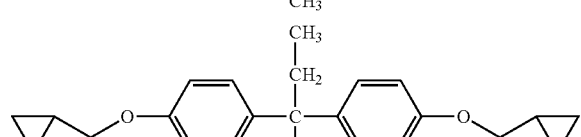
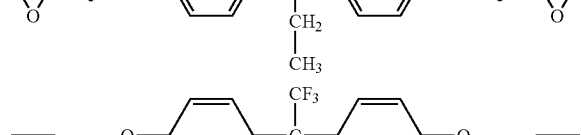
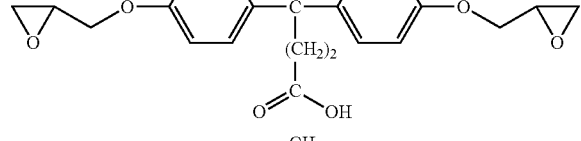
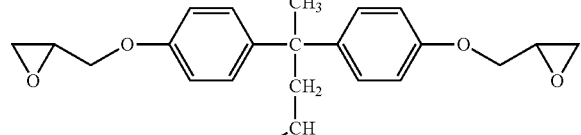
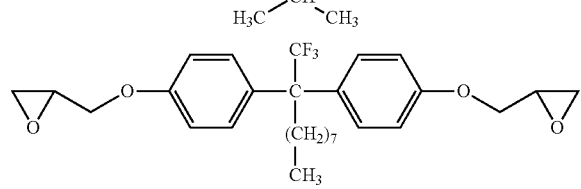

-continued

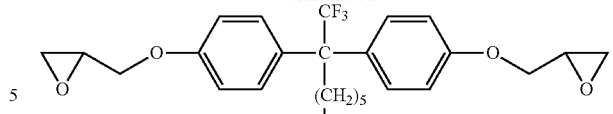
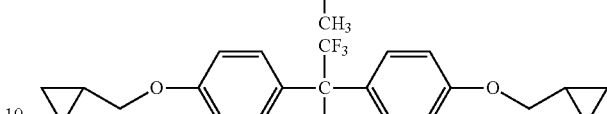
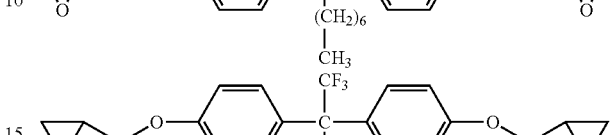
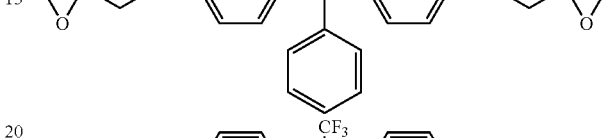
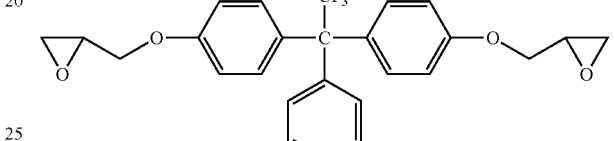
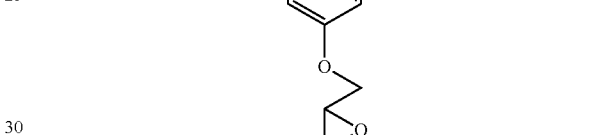
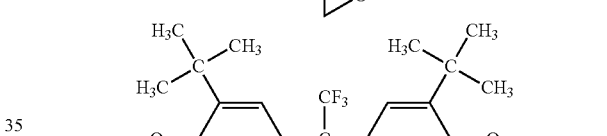
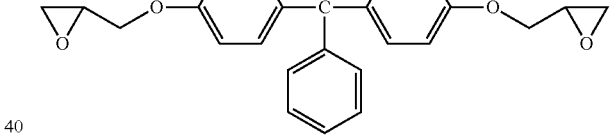

The silicone derivative or the epoxy-containing compound can be individually used singly or in combination of two or more kinds thereof. The total amount thereof is preferably 1 to 70 weight parts, more preferably 5 to 30 weight parts based on 100 weight parts in total of the polysiloxane and the alkali-soluble resin.

The composition preferably contains both the silicone derivative and the epoxy-containing compound. That is because the epoxy-containing compound enhances cross-linking of the resin while the silicone derivative fulfills the function of protecting the pattern.

(V) Polymerization Initiator

The composition according to the present invention contains a polymerization initiator. There are two kinds of polymerization initiators: one is a polymerization initiator which generates an acid, base or radical when exposed to radiation, and the other is a polymerization initiator which generates an acid, base or radical when exposed to heat. In the present invention, the former is preferred in view of the simplification and cost reduction of the process because it can start the reaction immediately after exposure of radiation and hence can make it unnecessary to carry out the reheating step after exposure before development. It is particularly preferred to use a photo-radical generator.

The photo-radical generator can reinforce the pattern shape or can increase contrast in development to improve the resolution. The photo-radical generator adoptable in the present invention releases a radical when exposed to radiation. Examples of the radiation include visible light, UV rays, IR rays, X-rays, electron beams, α-rays and γ-rays.

The optimum amount of the photo-radical generator depends on the kind of the active substance released by decomposition of the generator, on the amount of the released substance, on the required sensitivity and on the required dissolution contrast between the exposed and unexposed areas. However, the amount is preferably 0.001 to 30 weight parts, more preferably 0.01 to 10 weight parts, based on 100 weight parts in total of the polysiloxane and the alkali-soluble resin. If the amount is less than 0.001 weight part, the dissolution contrast between the exposed and unexposed areas may be too low to obtain the effect of the initiator. On the other hand, if it is more than 30 weight parts, the formed film may suffer from cracks or may be colored by decomposition of the generator so seriously that the colorless transparency of the coating film may be impaired. Further, if the photo-radical generator is contained too much, the thermally decomposed generator may lower the electric insulation of the cured film or may release gases to cause troubles in the post-treatments. Furthermore, it often deteriorates resistance of the coating film against a photoresist remover containing monoethanolamine or the like as a main ingredient.

Examples of the above photo-radical generator include azo-type, peroxide-type, acylphosphine oxide-type, alkylphenone-type, oxime ester-type and titanocene-type initiators. Among them, preferred are alkylphenone-type, acylphosphine oxide-type and oxime ester-type initiators. Examples of the preferred initiators include: 2,2-dimethoxy-1,2-diphenylethane-1-on, 1-hydroxy-cyclohexylphenyl ketone, 2-hydroxy-2-methyl-1-phenylpropane-1-on, 1-[4-(2-hydroxyethoxy)phenyl]-2-hydroxy-2-methyl-1-propane-1-on, 2-hydroxy-1-{4-[4-(2-hydroxy-2-methylpropionyl) benzyl]phenyl}-2-methylpropane-1-on, 2-methyl-1-(4-methylthiophenyl)-2-morpholinopropane-1-on, 2-benzyl-2-dimethylamino-1-(4-morpholinophenyl)-1-butanone, 2-(dimethylamino)-2-[(4-methylphenyl)methyl]-1-[4-(4-morpholinyl)phenyl]-1-butanone, 2,4,6-trimethylbenzoyldiphenylphosphine oxide, bis(2,4,6-trimethylbenzoyl)phenylphosphine oxide, 1,2-octanedione, 1-[4-(phenylthio)-2-(o-benzoyloxime)]ethanone, and 1-[9-ethyl-6-(2-methylbenzoyl)-9H-carbazole-3-yl]-1-(o-acetyloxime).

(VI) Solvent

The composition according to the present invention contains a solvent. There are no particular restrictions on the solvent as long as it can homogeneously dissolve or disperse the above polysiloxane, the above alkali-soluble resin, the above (meth)acryloyloxy-containing compound, the above silicone derivative or the epoxy-containing compound, the above polymerization initiator, and additives incorporated optionally. Examples of the solvent usable in the present invention include: ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; ethylene glycol alkyl ether acetates, such as, methyl cellosolve acetate and ethyl cellosolve acetate; propylene glycol monoalkyl ethers, such as propylene glycol monomethyl ether and propylene glycol monoethyl ether; propylene glycol alkyl ether acetates, such as, propylene glycol monomethyl ether acetate (PGMEA), propylene glycol monoethyl ether acetate, and propylene glycol monopropyl ether acetate; aromatic hydrocarbons, such as, benzene, toluene and xylene; ketones, such as, methyl ethyl ketone, acetone, methyl amyl ketone, methyl isobutyl ketone, and cyclohexanone; alcohols, such as, ethanol, propanol, butanol, hexanol, cyclohexanol, ethylene glycol, and glycerin; esters, such as, ethyl lactate, ethyl 3-ethoxypropionate, and methyl 3-methoxypropionate; and cyclic asters, such as, y-butyrolactone. In view of the availability, easiness of handling and solubility of the polymer, straight- or branched chain alcohols having alkyl groups of 4 or 5 carbon atoms are preferably used in combination with esters or propylene glycol alkyl ether acetates. The mixing ratio of the alcohol is preferably 5 to 80% in view of the coating properties and storage stability.

The amount of the solvent in the composition according to the present invention can be freely controlled according to the method of coating the composition. For example, if the composition is intended to be coated by spray coating, it can contain the solvent in an amount of 90 wt % or more. Further, if a slit-coating method, which is often adopted in coating a large substrate, is intended to be carried out, the content of the solvent is normally 60 wt % or more, preferably 70 wt % or more. However, the amount of the solvent gives little effect to the characteristics of the composition of the present invention.

The composition of the present invention necessarily comprises the above (I) to (VI), but can further comprise optional compounds in combination. Those combinable substances will be described below. The total amount of the ingredients other than (I) to (VI) is preferably 60% or less, more preferably 50% or less based on the whole weight when a colorant is added, but is preferably 40% or less, more preferably 30% or less when no colorant is added.

(VII) Additives

The composition of the present invention may contain other additives, if necessary. Examples of the additives include supplementary crosslinking agent, developer-dissolution promoter, scum remover, adhesion enhancer, polymerization inhibitor, defoaming agent, surfactant, sensitizer, curing agent, and colorant.

If necessary, the composition of the present invention can contain a supplementary crosslinking agent. Here, the "supplementary crosslinking agent" means an agent which is not categorized into the above (III) or (IV-B) but which can react to form a crosslinking structure.

Examples of the supplementary crosslinking agent include melamine or isocyanate compounds having methylol or alkoxylmethyl groups.

Concrete examples of the melamine compound usable as the supplementary crosslinking agent include: NIKALAC MW-390, NIKALAC MW-100LM, NIKALAC MX-750LM, NIKALAC MX-270, and NIKALAC MX-280. Those melamine compounds contain imino, methylol, methoxymethyl and the like groups.

Concrete examples of the isocyanate compound include: KBM-9659, X-12-9659 and KBM-585 ([trademarks], manufactured by Shin-Etsu Chemical Co., Ltd.). Also preferred are polymers including those structures, which may be partly substituted with silicone groups. Further, hexamethylene diisocyanate, cyclohexane diisocyanate, and Karenz AOI, Karenz MOI-BM, Karenz MOI-BP and Karenz BEI ([trademarks], manufactured by SHOWA DENKO K.K.) can be employed.

The amount of the supplementary crosslinking agent is 0 to 50 weight parts, preferably 2 to 50 weight parts, more preferably 5 to 20 weight parts based on 100 weight parts in total of the polysiloxane and the alkali-soluble resin. If it is 5 weight parts or more, the resolution can be sufficiently improved. On the other hand, if it is 50 weight parts or less, there is little fear that gaps in the pattern are filled to lower the resolution. The above compounds can be used singly or in mixture of two or more.

The developer-dissolution promoter or the scum remover has functions of controlling solubility of the formed coating film in a developer and of preventing scum from remaining on the substrate after development. As this additive, crown ethers can be adopted. Crown ethers having the simplest structures are represented by the general formula: (—$CH_2$—$CH_2$—O—)$_n$. Among them, crown ethers of the formula in which n is 4 to 7 are preferably used in the present invention. Meanwhile, crown ethers are often individually referred to as "x-crown-y-ether" in which x and y represent the total number of atoms forming the ring and the number of oxygen atoms included therein, respectively. In the present invention, the additive is preferably selected from the group consisting of crown ethers of X=12, 15, 18 and 21 and y=x/3, benzo-condensed products thereof, and cyclohexyl-condensed products thereof. Preferred examples of the crown ethers include 21-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclohexyl-21-crown-7-ether, dicyclohexyl-18-crown-6-ether, dicyclohexyl-15-crown-5-ether, and dicyclohexyl-12-crown-4-ether. Among them, it is particularly preferred to select the additive from the group consisting of 18-crown-6-ether and 15-crown-5-ether. The amount thereof is preferably 0.05 to 15 weight parts, more preferably 0.1 to 10 weight parts, based on 100 weight parts in total of the polysiloxane and the alkali-soluble resin.

The adhesion enhancer has a function of preventing the pattern from being peeled off by stress loaded thereon after curing when a cured film is formed from the composition of the present invention. As the adhesion enhancer, imidazoles and silane coupling agents are preferably adopted. Examples of the imidazoles include 2-hydroxybenzimidazole, 2-hydroxyethylbenzimidazole, benzimidazole, 2-hydroxyimidazole, imidazole, 2-mercaptoimidazole, and 2-aminoimidazole. Among them, particularly preferred are 2-hydroxybenzimidazole, benzimidazole, 2-hydroxyimidazole and imidazole.

Examples of the polymerization inhibitor include nitrone, nitroxide radical, hydroquinone, catechol, phenothiazine, phenoxazine, hindered amine, derivatives thereof, and UV absorbers. Among them, preferred are methylhydroquinone, catechol, 4-t-butylcatechol, 3-methoxycatechol, phenothiazine, chlorpromazine, phenoxazine, hindered amines such as TINUVIN 144, 292 and 5100 ([trademarks], manufactured by BASF), and UV absorbers such as TINUVIN 326, 328, 384-2, 400 and 477 ([trademarks], manufactured by BASF). Those can be used singly or in combination of two or more. The amount thereof is preferably 0.01 to 20 weight parts based on 100 weight parts in total of the polysiloxane and the alkali-soluble resin.

Examples of the defoaming agent include: alcohols ($C_1$ to $C_{18}$); higher fatty acids, such as, oleic acid and stearic acid; higher fatty acid esters, such as, glycerin monolaurate; polyethers, such as, polyethylenglycol (PEG) (Mn: 200 to 10000) and polypropyleneglycol (PPG) (Mn: 200 to 10000); silicone compounds, such as, dimethyl silicone oil, alkyl-modified silicone oil and fluoro-silicone oil; and organic siloxane surfactants described below in detail. Those can be used singly or in combination of two or more. The amount thereof is preferably 0.1 to 3 weight parts based on 100 weight parts in total of the polysiloxane and the alkali-soluble resin.

If necessary, the composition of the present invention can further contain a surfactant, which is incorporated with the aim of improving coating properties, developability and the like. The surfactants usable in the present invention are, for example, nonionic, anionic and amphoteric surfactants.

Examples of the nonionic surfactants include: polyoxyethylene alkyl ethers, such as, polyoxyethylene lauryl ether, polyoxyethylene oleyl ether and polyoxyethylene cetyl ether; polyoxyethylene fatty acid diethers; polyoxyethylene fatty acid monoethers; polyoxyethylene-polyoxypropylene block polymer; acetylene alcohol; acetylene alcohol derivatives, such as polyethoxyate of acetylene alcohols; acetylene glycol; acetylene glycol derivatives such as polyethoxyate of acetylene glycols; fluorine-containing surfactants, such as, Fluorad ([trademark], manufactured by Sumitomo 3M Limited), MEGAFAC ([trademark], manufactured by DIC Corporation), and Surufuron ([trademark], manufactured by Asahi Glass Co., Ltd.); and organic siloxane surfactants, such as, KP341 ([trademark], manufactured by Shin-Etsu Chemical Co., Ltd.). Examples of the above acetylene glycols include: 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, and 2,5-dimethyl-2,5-hexanediol.

Examples of the anionic surfactants include: ammonium salts and organic amine salts of alkyldiphenylether disulfonic acids, ammonium salts and organic amine salts of alkyldiphenylether sulfonic acids, ammonium salts and organic amine salts of alkylbenzenesulfonic acids, ammonium salts and organic amine salts of polyoxyethylenealkylether sulfuric acids, and ammonium salts and organic amine salts of alkylsulfuric acids.

Further, examples of the amphoteric surfactants include 2-alkyl-N-carboxymethyl-N-hydroxyethyl imidazolium betaine, and laurylic acid amidopropyl hydroxy sulfone betaine.

Those surfactants can be used singly or in combination of two or more. The amount thereof is normally 50 to 10000 ppm, preferably 100 to 8000 ppm based on the composition of the present invention.

According to necessity, a sensitizer can be incorporated into the composition of the present invention.

Examples of the sensitizer preferably used in the composition of the present invention include coumarin, ketocoumarin, derivatives thereof, thiopyrylium salts, and acetophenone. Specifically, concrete examples thereof include: sensitizing dyes, such as, p-bis(o-methylstryl)benzene, 7-dimethylamino-4-methylquinolone-2,7-amino-4-methylcoumarin, 4,6-dimethyl-7-ethylaminocoumarin, 2-(p-dimethylaminostyryl)-pyridylmethyl iodide, 7-diethylaminocoumarin, 7-diethylamino-4-methylcoumarin, 2,3,5,6-1H,4H-tetrahydro-8-methylquinolidino-<9,9a,1gh>coumarin, 7-diethylamino-4-trifluoromethylcoumarin, 7-dimethylamino-4-trifluoromethylcoumarin, 7-amino-4-trifluoromethylcoumarin, 2,3,5,6-1H,4H-tetrahydroquinolidino-<9,9a,1-gh>coumarin, 7-ethylamino-6-methyl-4-trifluoromethylcoumarin, 7-ethylamino-4-trifluoromethylcoumarin, 2,3,5,6-1H,4H-tetrahydro-9-carboethoxyquinolidino-<9,9a,1-gh> coumarin, 3-(2'-N-methylbenzimidazolyl)-7-N,N-diethylamino coumarin, N-methyl-4-trifluoromethylpiperidino-<3,2-g>coumarin, 2-(p-dimethylaminostyryl)-benzothiazolylethyl iodide, 3-(2'-benzimidazolyl)-7-N,N-diethylaminocoumarin, 3-(2'-benzothiazolyl)-7-N,N-diethylaminocoumarin, and pyrylium or thiopyrylium salts represented by the following formula. The sensitizing dye makes it possible to carry out patterning by use of inexpensive light sources, such as, a high-pressure mercury lamp (360 to 430 nm). The amount thereof is preferably 0.05 to 15 weight parts, more preferably 0.1 to 10 weight parts based on 100 weight parts in total of the polysiloxane and the alkali-soluble resin.

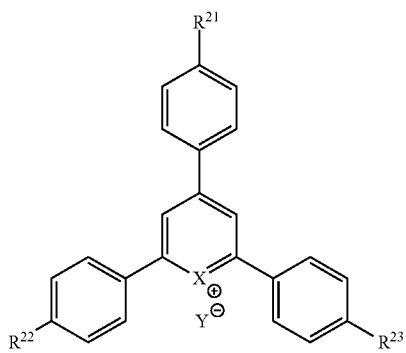

| X | R²¹ | R²² | R²³ | Y |
|---|---|---|---|---|
| S | OC₄H₉ | H | H | BF₄ |
| S | OC₄H₉ | H | H | BF₄ |
| S | OC₄H₉ | OCH₃ | OCH₃ | BF₄ |
| S | H | OCH₃ | OCH₃ | BF₄ |
| S | N(CH₃)₂ | H | H | ClO₂ |
| S | OC₄H₉ | H | H | SbF₆ |

As the sensitizer, it is also possible to adopt a compound having an anthracene skeleton. Concrete examples thereof include compounds represented by the following formula (C):

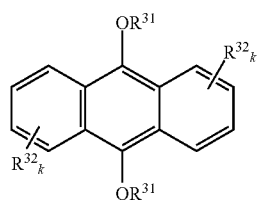

(C)

in which each $R^{31}$ is independently a substituent group selected from the group consisting of alkyl groups, aralkyl groups, aryl groups, hydroxyalkyl groups, alkoxyalkyl groups, glycidyl groups and halogenated alkyl groups;

each $R^{32}$ is independently a substituent group selected from the group consisting of hydrogen, alkyl groups, alkoxy groups, halogen atoms, nitro groups, sulfonic acid groups, hydroxyl group, amino groups, and carboalkoxy groups; and each k is independently an integer of 0 or 1 to 4.

When the sensitizer having an anthracene skeleton is added, the amount thereof is preferably 0.01 to 5 weight parts based on 100 weight parts in total of the polysiloxane and the alkali-soluble resin.

Further, if necessary, a stabilizer can be also added into the composition of the present invention. The stabilizer can be freely selected from those generally known. However, in the present invention, aromatic amines are preferred because they have high effect on stabilization. Among those aromatic amines, preferred are pyridine derivatives and particularly preferred are pyridine derivatives having bulky substituent groups at 2- and 6-positions. Concrete examples thereof are as follows:

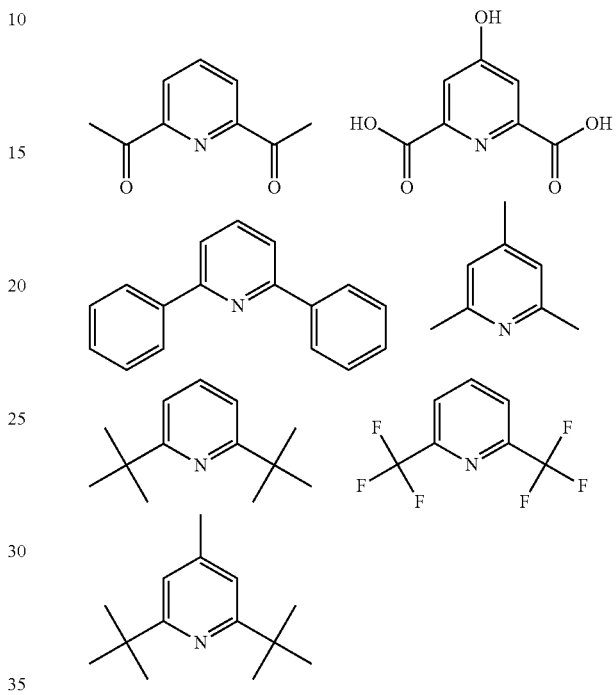

Further, according to necessity, a curing agent can be incorporated into the composition of the present invention. The curing agent can reinforce the pattern shape or can increase contrast in development to improve the resolution. The curing agent adoptable in the present is, for example, a photo acid-generator, which decomposes when exposed to radiation and releases an acid serving as an active substance for photo-curing the composition; or a photo base-generator, which releases a base when exposed to radiation. Examples of the radiation include visible light, UV rays, IR rays, X-rays, electron beams, α-rays and γ-rays.

The amount of the curing agent depends on the kind of the active substance released from the decomposed agent, on the amount of the released substance, on the required sensitivity and on the required dissolution contrast between the exposed and unexposed areas. However, it is preferably 0.001 to 10 weight parts, more preferably 0.01 to 5 weight parts, based on 100 weight parts in total of the polysiloxane and the alkali-soluble resin. If the amount is less than 0.001 weight part, the dissolution contrast between the exposed and unexposed areas may be too low to obtain the effect of the agent. On the other hand, if it is more than 10 weight parts, the formed film may suffer from cracks or may be colored by decomposition of the agent so seriously that the colorless transparency of the film may be impaired. Further, if the curing agent is contained too much, the thermally decomposed agent may lower the electric insulation of the cured film or may release gases to cause troubles in the post-treatments. Furthermore, it often deteriorates resistance of the coating film against a photoresist remover containing monoethanolamine or the like as a main ingredient.

The above photo acid-generator can be freely selected from those generally used, and examples thereof include diazomethane compounds, triazine compounds, sulfonic acid esters, diphenyliodonium salts, triphenylsulfonium salts, sulfonium salts, ammonium salts, phosphonium salts, and sulfonimide compounds.

In addition to the above, examples of the employable photo acid-generator include: 4-methoxyphenyldiphenylsulfonium hexafluorophosphonate, 4-methoxyphenyldiphenylsulfonium hexafluoroarsenate, 4-methoxyphenyldiphenylsulfonium methanesulfonate, 4-methoxyphenyldiphenylsulfonium trifluoroacetate, triphenylsulfonium tetrafluoroborate, triphenylsulfonium tetrakis(pentafluorophenyl)borate, triphenylsulfonium hexafluorophosphonate, triphenylsulfonium hexafluoroarsente, 4-methoxyphenyldiphenylsulfonium-p-toluenesulfonate, 4-phenylthiophenyldiphenyl tetrafluoroborate, 4-phenylthiophenyldiphenyl hexafluorophosphonate, triphenylsulfonium methanesulfonate, triphenylsulfonium trifluoroacetate, triphenylsulfonium-p-toluenesulfonate, 4-methoxyphenyldiphenylsulfonium tetrafluoroborate, 4-phenylthiophenyldiphenyl hexafluoroarsenate, 4-phenylthiophenyldiphenyl-p-toluenesulfonate, N-(trifluoromethylsulfonyloxy)succinimide, N-(trifluoromethylsulfonyloxy)phthalimide, 5-norbornene-2,3-dicarboxyimidyl triflate, 5-norbornene-2,3-dicarboxyimidyl-p-toluenesulfonate, 4-phenylthiophenyldiphenyl trifluoromethanesulfonate, 4-phenylthiophenyldiphenyl trifluoroacetate, N-(trifluoromethylsulfonyloxy)diphenylmaleimide, N-(trifluoromethylsulfonyloxy)bicyclo[2.2,1]hept-5-ene-2,3-dicarboximide, N-(trifluoromethylsulfonyloxy)naphthylimide, and N-(nonaflurorobutylsulfonyloxy)naphthylimide.

Further, according to necessity, a colorant can be incorporated into the composition of the present invention. Various known organic and inorganic colorants are employable, but inorganic colorants are preferred in view of the heat resistance. Examples thereof include carbon black, titanium black pigment, iron oxide pigment, and composite metal oxide pigment.

The amount of the colorant is preferably 0.1 to 50 weight parts based on 100 weight parts in total of the polysiloxane and the alkali-soluble resin. If it is less than 0.1 weight part, sufficient light-shielding effect cannot be obtained. On the other hand, if it is more than 50 weight parts, light-shielding effect may be so large that the photosensitive material cannot be exposed enough to obtain a pattern.

Method for Forming a Cured Film

The cured film-formation method according to the present invention comprises: coating the above composition on a substrate surface, to form a coating film; and heating to cure the film. The cured film-formation method will be explained below in the order of the steps.

(1) Coating Step

First, the above composition is coated on a substrate to form a coating film. In the present invention, the coating film can be formed in any known manner for coating a photosensitive composition. Specifically, the coating method can be freely selected from, for example, immersion coating, roll coating, bar coating, brush coating, spray coating, doctor coating, flow coating, spin coating, or slit coating. The substrate to be coated with the composition can be also properly selected from, for example, a silicon substrate, a glass substrate or a resin film. According to necessity, those substrates may be equipped with various semiconductor elements and the like formed thereon. If the substrate is in the form of a film, the coating film can be formed by gravure coating. If desired, a drying step can be independently carried out after coating. Further, according to necessity, the coating step may be repeatedly carried out once or twice or more so as to form a film of desired thickness.

(2) Prebaking Step

After the composition is coated to form a coating film, the film is preferably subjected to prebaking (preheating treatment) for the purposes of drying the film and of reducing the solvent left therein. The prebaking step is carried out at a temperature of generally 50 to 150° C., preferably 90 to 120° C. for 10 to 300 seconds, preferably 30 to 120 seconds on a hot-plate or for 1 to 30 minutes in a clean oven.

(3) Exposing Step

After the coating film is formed, the surface thereof is exposed to light. As a light source for the exposure, it is possible to adopt any light source used in conventional pattern-formation processes. Examples of the light source include high-pressure mercury lamp, low-pressure mercury lamp, metal halide lamp, xenon lamp, laser diode and LED. Light for the exposure is normally UV rays of g-line, h-line, i-line or the like. Except for in the case of ultrafine fabrication of semiconductors and the like, it is general to use light of 360 to 430 nm (high-pressure mercury lamp) for patterning in several micrometers to several tens of micrometers. Particularly in producing a liquid crystal display, light of 430 nm is often used. As described above, in that case, it is advantageous to combine a sensitizing dye with the composition of the present invention. Energy of the exposure light depends on the light source and the thickness of the coating film, but is generally 5 to 2000 mJ/cm$^2$, preferably 10 to 1000 mJ/cm$^2$. If the exposure energy is lower than 10 mJ/cm$^2$, it is often difficult to obtain satisfying resolution. On the other hand, however, if it is more than 2000 mJ/cm$^2$, the coating film is exposed so excessively that the exposure may cause halation.

In order that the coating film can be imagewise exposed to light, common photomasks are employable. Any photomask can be selected from known ones. There are no particular restrictions on the environmental conditions in the exposure, and the exposure can be carried out under an ambient atmosphere (the normal atmosphere) or under a nitrogen atmosphere. If a coating film is intended to be formed on the whole surface of the substrate, the whole substrate surface is exposed to light. In the present invention, the term "pattern film" includes a film thus formed on the whole surface of the substrate.

(4) Post-Exposure Baking Step

After the exposing step, post-exposure baking can be carried out according to necessity with the aim of promoting interpolymer reactions by the reaction initiator generated in the exposed area of the film. This heating treatment differs from the below-described heating step (6) in that it is not for the purpose of curing the coating film completely but for the purpose of making it possible to leave a desired pattern on the substrate after development and to remove the part other than the pattern by development. The post-exposure baking step is, therefore, not indispensable in the present invention.

When the post-exposure baking step is carried out, it is possible to use a hot-plate, an oven, a furnace or the like. The heating temperature should not be too high because it is unfavorable for acid generated by exposure in the exposed area to diffuse into the unexposed area. In view of that, the temperature of post-exposure baking is preferably 40 to 150° C., more preferably 60 to 120° C. If necessary, the temperature may be step-by-step increased so as to control the curing speed of the composition. There are no particular restrictions on the atmosphere of baking. In order to control the curing speed of the composition, the atmosphere can be selected from, for example, an atmosphere of inert gas such as nitrogen gas, a vacuum atmosphere, a reduced-pressure atmosphere, an oxygen gas atmosphere or the like. The baking time is preferably longer than a certain period so as to keep higher uniformity of thermal budget in the wafer surface, but also preferably not excessively long so as to prevent the diffusion of acid. In consideration of those, the baking time is preferably 20 to 500 seconds, more preferably 40 to 300 seconds.

(5) Development Step

After the exposing step, the film is optionally subjected to the post-exposure baking step and thereafter subjected to developing treatment. As a developer used in the development step, it is possible to adopt any developer employed for developing conventional photosensitive compositions. The developer is preferably an alkali developer, which is an aqueous solution of alkaline compound, such as, tetraalkylammonium hydroxide, choline, alkali metal hydroxide, alkali metal metasilicate (hydrate), alkali metal phosphate (hydrate), sodium carbonate, ammonia, alkylamine, alkanolamine, or heterocyclic amine. Particularly preferred alkali developers are aqueous solutions of tetramethylammonium hydroxide, potassium hydroxide, sodium hydroxide and sodium carbonate. Those alkali developers may further contain surfactants or water-soluble organic solvents, such as, methanol and ethanol, if necessary. In the present invention, the film can be developed with a developer of lower concentration than 2.3 wt % TMAH developer, which is a commonly used developer. Examples of the low concentration developer include: 0.05 to 1.5 wt % TMAH aqueous solution, 0.1 to 2.5 wt % sodium carbonate aqueous solution, and 0.01 to 1.5 wt % potassium hydroxide aqueous solution. The developing time is normally 10 to 300 seconds, preferably 30 to 180 seconds.

The developing method can be freely selected from known methods, such as, dip, paddle, shower, slit, cap coat and spray development processes. As a result of the development, a pattern can be obtained. After developed with a developer, the pattern is preferably washed with water.

(6) Heating Step (Post Baking Step)

After the development step, the obtained pattern film is heated and thereby cured. The heating apparatus used in the heating step (also called post baking step) can be the same as that used in the post-exposure baking step. The heating temperature in this heating step is not particularly restricted and can be freely determined as long as the film can be cured. In consideration that the remaining silanol groups may prevent the cured film from having sufficient chemical resistance and also may increase the permittivity of the cured film, the heating temperature is generally selected to be relatively high. However, the composition of the present invention can be cured at a relatively low temperature. Specifically, the composition is preferably cured at a temperature of 360° C. or less. In order to leave the cured film in a high remaining film ratio, the curing temperature is more preferably 300° C. or less, further preferably 250° C. or less. On the other hand, in order to promote the curing reaction and to obtain a sufficiently cured film, the temperature is preferably 70° C. or more, further preferably 100° C. or more, particularly preferably 110° C. or more. The heating time is also not particularly restricted, but is generally 10 minutes to 24 hours, preferably 30 minutes to 3 hours. Here, the "heating time" means a period of time from when the temperature of the pattern film is elevated to reach the aimed heating temperature. It normally takes several minutes to several hours to heat the pattern film from the initial temperature up to the aimed heating temperature.

The cured film thus obtained can achieve excellent transparency, chemical resistance and environmental durability. For example, if cured at 120° C., the film can achieve optical transmittance of 95% or more and specific permittivity of 4 or less. Even if the film is thereafter placed under conditions of a temperature of 65° C. and a humidity of 90% for 1000 hours, the specific permittivity does not get lower. Those characteristics of light transparency, specific permittivity, chemical resistance and environmental durability are not realized by conventional acrylic materials, and hence the cured film according to the present invention can be advantageously used in various applications. For example, as described above, it can be adopted as a planarization film of various devices such as flat panel display (FPD), as an interlayer insulating film for low temperature polysilicon, as a buffer coat film for IC chips, or as a transparent protective film.

The present invention will be further explained concretely by use of the following examples and comparative examples. However, those examples and comparative examples by no means restrict the present invention.

Measurements of gel permission chromatography (GPC) were carried out by use of HLC-8220GPC type high-speed GPC system ([trademark], manufactured by TOSOH CORPORATION) and two Super Multipore HZ-N type GPC columns ([trademark], manufactured by TOSOH CORPORATION) under the conditions of: standard sample: monodispersed polystyrene, developing solvent: tetrahydrofuran, flow: 0.6 ml/minute, and column temperature: 40° C.

Synthesis Example 1: Synthesis of Polysiloxane A
(Blend Ratio of pH, Me, Q, Ep=22:22:22:34)

In a 2-L flask equipped with a stirrer, a thermometer and a condenser, 400 ml of isopropyl alcohol (IPA), 100 ml of methyl isobutyl ketone and 29 g of water were placed. Independently, 21.8 g of phenyltrimethoxysilane (Ph), 15.0 g of methyltrimethoxysilane (Me), 22.9 g of tetramethoxysilane (Q) and 40.8 g of 3-glycidoxypropyltrimethoxysilane (Ep) were mixed to prepare a mixed solution, which was then placed in a dropping funnel. The mixed solution was then dropped into the flask at 10° C., and successively the obtained mixture was stirred at the same temperature for 3 hours. Subsequently, 275 g of acetic anhydride was added and then stirred at 40° C. for 10 hours. The mixture was cooled, and then 400 ml of toluene and 100 ml of water were added, so that the mixture was separated into two layers. The organic layer was collected and condensed under reduced pressure to remove the solvent. To the obtained concentrate, PGMEA was added so that the solid content might be 40 wt %.

The molecular weight (in terms of polystyrene reduced value) of the obtained polysiloxane was measured by GPC to find the weight average molecular weight Mw=2450. Further, the obtained resin solution was coated on a silicon wafer so that the formed film might have a thickness of 2 μm after prebaked by means of a spin-coater (MS-A100 [trademark], manufactured by MIKASA Co., Ltd.), and then prebaked. Thereafter, the alkali dissolution rate (hereinafter, often referred to as "ADR") in a 2.38% TMAH aqueous solution was measured and found to be 10500 Å/second.

Synthesis Example 2: Synthesis of Polysiloxane B
(Blend Ratio pH, Me, Q, Ac=22:22:22:34)

The procedure of Synthesis example 1 was repeated except that 3-glycidoxypropyltrimethoxysilane (Ep) was replaced with 3-acryloxypropyltrimethoxysilane (Ac) in the same amount, to synthesize polysiloxane B. The obtained polysiloxane B was measured to find Mw (polystyrene-reduced weight average molecular weight)=2180 and ADR=1400 Å/second in a 2.38% TMAH aqueous solution.

Synthesis Example 3: Synthesis of Polysiloxane C: Alkali Catalyzed Synthesis (Blend Ratio pH, Me, Q=50:40:10)

In a 2-L flask equipped with a stirrer, a thermometer and a condenser, 39.2 g of 25 wt % TMAH aqueous solution, 800 ml of isopropyl alcohol (IPA) and 2.0 g of water were placed. Independently, 39.7 g of phenyltrimethoxysilane (Ph), 34.1 g of methyltrimethoxysilane (Me) and 7.6 g of tetramethoxysilane (Q) were mixed to prepare a mixed solution, which was then placed in a dropping funnel. The mixed solution was dropped into the flask at 10° C., and successively the obtained mixture was stirred at the same temperature for 3 hours. Subsequently, 10% HCl aqueous solution was added to neutralize the mixture, and then 400 ml of toluene and 100 ml of water were added into the neutralized mixture, so that the mixture was separated into two layers. The organic layer was collected and condensed under reduced pressure to remove the solvent. To the obtained concentrate, PGMEA was added so that the solid content might be 40 wt %. The thus obtained polysiloxane C was measured to find Mw (polystyrene-reduced weight average molecular weight)=1400, ADR=8000 Å/second in a 2.38% TMAH aqueous solution.

Synthesis Example 4: Synthesis of Polysiloxane D (Blend Ratio pH, Me, Q, Ac, Ep=22:22:22:27:7)

The procedure of Synthesis example 1 was repeated except for changing the blend amounts of phenyltrimethoxysilane (Ph), methyltrimethoxysilane (Me), tetramethoxysilane (Q), 3-acryloxypropyltrimethoxysilane (Ac) and 3-glycidoxypropyltrimethoxysilane (Ep), to synthesize polysiloxane D. The obtained polysiloxane D was measured to find Mw (polystyrene-reduced weight average molecular weight)=2570 and ADR=6200 Å/second in a 2.38% TMAH aqueous solution.

Synthesis Example 5 (Synthesis of Polysiloxane E: Alkali Catalyzed Synthesis)

The procedure of Synthesis example 3 was repeated except for changing the amount of the TMAH aqueous solution into 25.5 g, to synthesize polysiloxane E. The obtained polysiloxane E was measured to find Mw (polystyrene-reduced weight average molecular weight)=2800 and ADR=50 Å/second in a 2.38% TMAH aqueous solution.

Synthesis Examples (Synthesis of Alkali-Soluble Resins A to J)

In a flask equipped with a stirrer, a thermometer, a condenser and a nitrogen gas-inlet tube, each solvent shown in Table 2 was placed. Under an atmosphere of nitrogen gas, the solvent was then heated to a temperature properly determined by reference to the 10-hour half-life temperature of each initiator. Independently, each monomer shown in Table 1 and each initiator shown in Table 2 were mixed to prepare a mixture, which was then dropped into the solvent over 4 hours. Subsequently, the reaction was let to proceed for 3 hours, to individually produce solutions of alkali-soluble resins A to J. The blend amounts in Tables are shown in terms of weight parts.

TABLE 1

| alkali-soluble resin | monomers | | | | | | | | |
|---|---|---|---|---|---|---|---|---|---|
| | carboxyl-cont. | | alkoxysilyl-cont. | | hydroxyl-cont. | | others | | |
| | AA | MAA | KBM503 | KBM502 | HEMA | HEA | MMA | BA | Sty |
| A | 0 | 15 | 0 | 10 | 20 | 0 | 25 | 10 | 20 |
| B | 0 | 10 | 5 | 5 | 10 | 10 | 30 | 20 | 10 |
| C | 10 | 10 | 0 | 10 | 20 | 0 | 25 | 25 | 0 |
| D | 0 | 15 | 0 | 10 | 5 | 0 | 50 | 10 | 10 |
| E | 0 | 10 | 5 | 5 | 10 | 10 | 30 | 20 | 10 |
| F | 5 | 5 | 10 | 10 | 10 | 10 | 50 | 0 | 0 |
| G | 0 | 15 | 0 | 10 | 30 | 0 | 40 | 0 | 5 |
| H | 0 | 5 | 10 | 0 | 0 | 20 | 35 | 30 | 0 |
| I | 0 | 30 | 0 | 10 | 0 | 20 | 30 | 10 | 0 |
| J | 0 | 15 | 5 | 5 | 10 | 10 | 40 | 15 | 0 |

Remarks)

AA: acrylic acid,

MAA: methacrylic acid,

KBM-503 ([trademark], manufactured by Shin-Esu Chemical Co., Ltd.):

γ-methacryloxypropyltrimethoxysilane,

KBM-502 ([trademark], manufactured by Shin-Esu Chemical Co., Ltd.):

γ-methacryloxypropylmethyldimethoxysilane,

HEMA: 2-hydroxyethyl methacrylate,

HEA: 2-hydroxyethyl acrylate,

MMA: methyl methacrylate,

BA: butyl acrylate,

Sty: styrene,

TABLE 2

| alkali-soluble resin | initiator | | adopted solvent | | | |
|---|---|---|---|---|---|---|
| | AIBN | V-65 | C4 alcohol butanol | C5 alcohol pentanol | acetate PGMEA | ester ethyl lactate |
| A | 10 | 0 | 100 | 0 | 0 | 50 |
| B | 10 | 0 | 50 | 50 | 50 | 0 |
| C | 10 | 0 | 150 | 0 | 0 | 0 |
| D | 15 | 0 | 100 | 0 | 50 | 0 |
| E | 0 | 3 | 100 | 0 | 50 | 0 |
| F | 10 | 0 | 100 | 0 | 50 | 0 |
| G | 10 | 0 | 100 | 50 | 0 | 0 |
| H | 10 | 0 | 50 | 0 | 50 | 50 |
| I | 10 | 0 | 100 | 0 | 50 | 0 |
| J | 0 | 1 | 100 | 0 | 0 | 50 |

Remarks)
AIBN: azobisisobutyronitrile,
V-65 ([trademark], manufactured by Wako Pure Chemical Industries, Ltd.): 2,2'-azobis (2,4-dimethylvaleronitrile),
PGMEA: propylene glycol monomethyl ether acetate Table 3 shows the weight average molecular weight Mw and solid content acid value of each obtained alkali-soluble resin.

TABLE 3

| alkali-soluble resin | properties | |
|---|---|---|
| | Mw | solid content acid value NV100% |
| A | 7500 | 98 |
| B | 9000 | 65 |
| C | 9200 | 142 |
| D | 3200 | 98 |
| E | 21000 | 65 |
| F | 8500 | 71 |
| G | 9000 | 98 |
| H | 6800 | 33 |
| I | 11000 | 195 |
| J | 42000 | 98 |

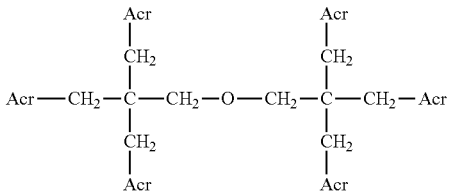

(acrylic monomer A)

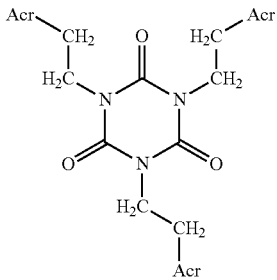

(acrylic monomer B)

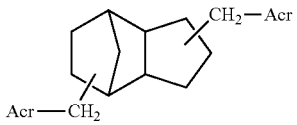

(acrylic monomer C)

wherein Acr =

Example 1

Solutions of the polysiloxanes A and C and a solution of the alkali-soluble resin A were mixed in a ratio of 3:7 in terms of solid content, to prepare a polymer mixture. To the mixture, acrylic monomer A, acrylic monomer B (tris(2-acryloyloxy ethyl)isocyanurate) and acrylic monomer C, which are individually represented by the following formulas, were added each in an amount of 10 weight parts. Further, 10 weight parts of "KR-213" ([trademark], manufactured by Shin-Etsu Chemical Co., Ltd.) as the silicone derivative, 2 weight parts of Irgacure OXE-02 ([trademark], manufactured by BASF; radical generator A) as the photo-radical generator, and 0.5 weight part of AKS-10 ([trademark], manufactured by Shin-Etsu Chemical Co., Ltd.) as the surfactant were added. Finally, PGMEA was added so that the solid content might be 38 wt % to obtain a composition, whose dissolution rate in a 0.25% sodium carbonate aqueous solution was found to be 1250 Å/second. Here, the blend ratio (in terms of weight part) of each ingredient is based on the assumption that the total weight of the polysiloxanes and the alkali-soluble resin is regarded as 100 weight parts.

The composition was then spin-coated on a silicon wafer, and then prebaked on a hot-plate at 100° C. for 90 seconds so as to form a film of 5 μm thickness. The film was then confirmed to have no tucks and not to be adhesive, and thereafter subjected to exposure at 50 mJ/cm² by means of i-line exposure system. Subsequently, the film was immersed for 90 seconds in a 0.25% sodium carbonate aqueous solution, and rinsed with pure water for 30 seconds. As the result, it was confirmed that 10-μm dot and contact-hole patterns were formed. The remaining film ratio after development was found to be 95%. After the patterns were formed, the film was cured at 230° C. for 1 hour. The chemical resistance to acid and base was tested on the obtained patterns, and consequently they were confirmed to remain even after the test.

Examples 2 to 18, Comparative Examples 1 to 12

The procedure of Example 1 was repeated except for changing the ingredients into those shown in Table 4 or 5, to prepare and evaluate the compositions. The results are shown in Table 4 or 5.

TABLE 4

| | | Examples | | | | | | | | | | | | | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 |
| ingridients | alkali-soluble resin A | 70 | 70 | 70 | 70 | 70 | 70 | 70 | 70 | 70 | 70 | 70 | 70 | 70 | 70 | 70 |
| | alkali-soluble resin B | 0 | 0 | 0 | 0 | 0 | 0 | 0 | 0 | 0 | 0 | 0 | 0 | 0 | 0 | 0 |
| | alkali-soluble resin C | 0 | 0 | 0 | 0 | 0 | 0 | 0 | 0 | 0 | 0 | 0 | 0 | 0 | 0 | 0 |
| | alkali-soluble resin D | 0 | 0 | 0 | 0 | 0 | 0 | 0 | 0 | 0 | 0 | 0 | 0 | 0 | 0 | 0 |
| | alkal-soluble resin E | 0 | 0 | 0 | 0 | 0 | 0 | 0 | 0 | 0 | 0 | 0 | 0 | 0 | 0 | 0 |
| | alkali-soluble resin F | 0 | 0 | 0 | 0 | 0 | 0 | 0 | 0 | 0 | 0 | 0 | 0 | 0 | 0 | 0 |
| | alkali-soluble resin G | 0 | 0 | 0 | 0 | 0 | 0 | 0 | 0 | 0 | 0 | 0 | 0 | 0 | 0 | 0 |
| | alkali-soluble resin H | 0 | 0 | 0 | 0 | 0 | 0 | 0 | 0 | 0 | 0 | 0 | 0 | 0 | 0 | 0 |
| | alkali-soluble resin I | 0 | 0 | 0 | 0 | 0 | 0 | 0 | 0 | 0 | 0 | 0 | 0 | 0 | 0 | 0 |
| | alkali-soluble resin J | 0 | 0 | 0 | 0 | 0 | 0 | 0 | 0 | 0 | 0 | 0 | 0 | 0 | 0 | 0 |
| | polysiloxane A | 5 | 5 | 5 | 5 | 5 | 5 | 5 | 5 | 30 | 0 | 0 | 0 | 0 | 0 | 0 |
| | polysiloxane B | 0 | 0 | 0 | 0 | 0 | 0 | 0 | 0 | 0 | 0 | 0 | 5 | 5 | 5 | 30 |
| | polysiloxane C | 25 | 25 | 25 | 25 | 25 | 25 | 25 | 20 | 0 | 25 | 0 | 25 | 25 | 25 | 0 |
| | polysiloxane D | 0 | 0 | 0 | 0 | 0 | 0 | 0 | 0 | 0 | 5 | 30 | 0 | 0 | 0 | 0 |
| | polysiloxane E | 0 | 0 | 0 | 0 | 0 | 0 | 0 | 5 | 0 | 0 | 0 | 0 | 0 | 0 | 0 |
| | acrylic monomer A | 10 | 10 | 10 | 20 | 20 | 20 | 20 | 20 | 20 | 20 | 20 | 20 | 10 | 20 | 20 |
| | acrylic monomer B | 10 | 10 | 10 | 20 | 20 | 20 | 20 | 20 | 20 | 20 | 20 | 10 | 20 | 20 | 20 |
| | acrylic monomer C | 10 | 10 | 10 | 0 | 0 | 0 | 0 | 0 | 0 | 0 | 0 | 0 | 0 | 0 | 0 |
| | epoxy-cont. compound | 0 | 0 | 0 | 10 | 10 | 10 | 10 | 10 | 10 | 10 | 10 | 0 | 0 | 0 | 0 |
| | silicone derivative A | 10 | 0 | 0 | 0 | 10 | 0 | 10 | 10 | 10 | 0 | 0 | 0 | 0 | 0 | 0 |
| | silicone derivative B | 0 | 10 | 0 | 0 | 0 | 0 | 0 | 0 | 0 | 0 | 0 | 0 | 0 | 0 | 0 |
| | silicone derivative C | 0 | 0 | 10 | 0 | 0 | 10 | 10 | 10 | 10 | 10 | 10 | 10 | 10 | 10 | 10 |
| | radical generator A | 2 | 2 | 2 | 2 | 2 | 2 | 2 | 2 | 2 | 2 | 2 | 2 | 2 | 2 | 2 |
| | radical generator B | 0 | 0 | 0 | 0 | 0 | 0 | 0 | 0 | 0 | 0 | 0 | 0 | 0 | 0 | 0 |
| results | remaining film ratio after development | 95% | 95% | 95% | 95% | 95% | 95% | 95% | 95% | 93% | 95% | 95% | 95% | 95% | 95% | 95% |
| | transparency | 97% | 97% | 97% | 97% | 97% | 97% | 97% | 97% | 95% | 97% | 97% | 97% | 97% | 97% | 95% |
| | chemical resistance/acid | A | A | A | A | A | A | A | A | A | A | A | A | A | A | A |
| | chemical resistance/base | A | A | A | A | A | A | A | A | A | A | A | A | A | A | A |
| | resolution | A | A | A | A | A | A | A | A | A | A | A | A | A | A | A |

| | | Examples | | | | | | | | | | | | | |
|---|---|---|---|---|---|---|---|---|---|---|---|---|---|---|---|
| | | 16 | 17 | 18 | 19 | 20 | 21 | 22 | 23 | 24 | 25 | 26 | 27 | 28 | 29 |
| ingridients | alkali-soluble resin A | 70 | 70 | 80 | 50 | 70 | 80 | 70 | 50 | 80 | 70 | 0 | 0 | 0 | 0 |
| | alkali-soluble resin B | 0 | 0 | 0 | 0 | 0 | 0 | 0 | 0 | 0 | 0 | 0 | 0 | 0 | 0 |
| | alkali-soluble resin C | 0 | 0 | 0 | 0 | 0 | 0 | 0 | 0 | 0 | 0 | 0 | 0 | 0 | 0 |
| | alkali-soluble resin D | 0 | 0 | 0 | 0 | 0 | 0 | 0 | 0 | 0 | 0 | 70 | 0 | 0 | 0 |
| | alkali-soluble resin E | 0 | 0 | 0 | 0 | 0 | 0 | 0 | 0 | 0 | 0 | 0 | 70 | 0 | 0 |
| | alkali-soluble resin F | 0 | 0 | 0 | 0 | 0 | 0 | 0 | 0 | 0 | 0 | 0 | 0 | 70 | 0 |
| | alkali-soluble resin G | 0 | 0 | 0 | 0 | 0 | 0 | 0 | 0 | 0 | 0 | 0 | 0 | 0 | 70 |
| | alkali-soluble resin H | 0 | 0 | 0 | 0 | 0 | 0 | 0 | 0 | 0 | 0 | 0 | 0 | 0 | 0 |
| | alkali-soluble resin I | 0 | 0 | 0 | 0 | 0 | 0 | 0 | 0 | 0 | 0 | 0 | 0 | 0 | 0 |
| | alkali-soluble resin J | 0 | 0 | 0 | 0 | 0 | 0 | 0 | 0 | 0 | 0 | 0 | 0 | 0 | 0 |
| | polysiloxane A | 0 | 0 | 5 | 15 | 0 | 0 | 5 | 15 | 5 | 5 | 5 | 5 | 5 | 5 |
| | polysiloxane B | 5 | 5 | 0 | 0 | 0 | 0 | 0 | 0 | 0 | 0 | 0 | 0 | 0 | 0 |
| | polysiloxane C | 25 | 25 | 15 | 35 | 30 | 0 | 25 | 35 | 10 | 25 | 25 | 25 | 25 | 25 |
| | polysiloxane D | 0 | 0 | 0 | 0 | 0 | 0 | 0 | 0 | 0 | 0 | 0 | 0 | 0 | 0 |
| | polysiloxane E | 0 | 0 | 0 | 0 | 0 | 20 | 0 | 0 | 5 | 0 | 0 | 0 | 0 | 0 |
| | acrylic monomer A | 10 | 10 | 20 | 20 | 10 | 10 | 10 | 10 | 10 | 10 | 20 | 20 | 20 | 20 |
| | acrylic monomer B | 10 | 10 | 20 | 20 | 10 | 10 | 10 | 10 | 10 | 10 | 20 | 20 | 20 | 20 |
| | acrylic monomer C | 10 | 10 | 0 | 0 | 10 | 10 | 0 | 10 | 10 | 0 | 0 | 0 | 0 | 0 |
| | epoxy-cont. compound | 0 | 0 | 10 | 10 | 10 | 10 | 10 | 10 | 10 | 20 | 10 | 10 | 10 | 10 |
| | silicone derivative A | 0 | 0 | 10 | 10 | 0 | 0 | 0 | 0 | 0 | 0 | 10 | 10 | 10 | 10 |
| | silicone derivative B | 0 | 0 | 0 | 0 | 0 | 0 | 0 | 0 | 0 | 0 | 0 | 0 | 0 | 0 |
| | silicone derivative C | 10 | 10 | 10 | 10 | 0 | 10 | 0 | 0 | 0 | 0 | 10 | 10 | 10 | 10 |
| | radical generator A | 2 | 0 | 2 | 2 | 2 | 2 | 2 | 2 | 2 | 2 | 2 | 2 | 2 | 2 |
| | radical generator B | 0 | 2 | 0 | 0 | 0 | 0 | 0 | 0 | 0 | 0 | 0 | 0 | 0 | 0 |
| results | remaining film ratio after development | 95% | 80% | 95% | 97% | 95% | 97% | 95% | 95% | 97% | 97% | 89% | 98% | 94% | 95% |
| | transparency | 97% | 97% | 95% | 93% | 97% | 94% | 97% | 97% | 94% | 94% | 97% | 92% | 97% | 97% |
| | chemical resistance/acid | A | A | A | A | A | A | A | A | A | A | A | A | A | A |
| | chemical resistance/base | A | A | A | A | A | A | A | A | A | A | A | A | A | A |
| | resolution | A | A | A | A | B | A | A | A | A | A | A | B | A | A |

TABLE 5

|  |  | Comparative examples | | | | | | | | | | | | | |
| --- | --- | --- | --- | --- | --- | --- | --- | --- | --- | --- | --- | --- | --- | --- | --- |
|  |  | 1 | 2 | 3 | 4 | 5 | 6 | 7 | 8 | 9 | 10 | 11 | 12 | 13 | 14 |
| ingredients | alkali-soluble resin A | 0 | 0 | 100 | 0 | 70 | 70 | 70 | 70 | 70 | 70 | 70 | 0 | 0 | 0 |
|  | alkali-soluble resin B | 70 | 0 | 0 | 0 | 0 | 0 | 0 | 0 | 0 | 0 | 0 | 0 | 0 | 0 |
|  | alkali-soluble resin C | 0 | 70 | 0 | 0 | 0 | 0 | 0 | 0 | 0 | 0 | 0 | 0 | 0 | 0 |
|  | alkali-soluble resin D | 0 | 0 | 0 | 0 | 0 | 0 | 0 | 0 | 0 | 0 | 0 | 0 | 0 | 0 |
|  | alkali-soluble resin E | 0 | 0 | 0 | 0 | 0 | 0 | 0 | 0 | 0 | 0 | 0 | 0 | 0 | 0 |
|  | alkali-soluble resin F | 0 | 0 | 0 | 0 | 0 | 0 | 0 | 0 | 0 | 0 | 0 | 0 | 0 | 0 |
|  | alkali-soluble resin G | 0 | 0 | 0 | 0 | 0 | 0 | 0 | 0 | 0 | 0 | 0 | 0 | 0 | 0 |
|  | alkali-soluble resin H | 0 | 0 | 0 | 0 | 0 | 0 | 0 | 0 | 0 | 0 | 0 | 70 | 0 | 0 |
|  | alkali-soluble resin I | 0 | 0 | 0 | 0 | 0 | 0 | 0 | 0 | 0 | 0 | 0 | 0 | 70 | 0 |
|  | alkali-soluble resin J | 0 | 0 | 0 | 0 | 0 | 0 | 0 | 0 | 0 | 0 | 0 | 0 | 0 | 70 |
|  | polysiloxane A | 30 | 0 | 0 | 0 | 30 | 0 | 0 | 0 | 30 | 30 | 30 | 5 | 5 | 5 |
|  | polysiloxane B | 0 | 0 | 0 | 0 | 0 | 30 | 0 | 0 | 0 | 0 | 0 | 0 | 0 | 0 |
|  | polysiloxane C | 0 | 30 | 0 | 10 | 0 | 0 | 30 | 0 | 0 | 0 | 0 | 25 | 25 | 25 |
|  | polysiloxane D | 0 | 0 | 0 | 0 | 0 | 0 | 0 | 30 | 0 | 0 | 0 | 0 | 0 | 0 |
|  | polysiloxane E | 0 | 0 | 0 | 0 | 0 | 0 | 0 | 0 | 0 | 0 | 0 | 0 | 0 | 0 |
|  | acrylic monomer A | 10 | 10 | 10 | 10 | 10 | 10 | 10 | 10 | 0 | 0 | 0 | 20 | 20 | 20 |
|  | acrylic monomer B | 10 | 10 | 10 | 10 | 10 | 10 | 10 | 10 | 0 | 0 | 0 | 20 | 20 | 20 |
|  | acrylic monomer C | 10 | 10 | 10 | 10 | 10 | 10 | 10 | 10 | 0 | 0 | 0 | 0 | 0 | 0 |
|  | epoxy-cont. compound | 0 | 0 | 0 | 0 | 0 | 0 | 0 | 0 | 0 | 10 | 10 | 10 | 10 | 10 |
|  | silicone derivative A | 0 | 0 | 0 | 0 | 0 | 0 | 0 | 0 | 0 | 0 | 0 | 10 | 10 | 10 |
|  | silicone derivative B | 0 | 0 | 0 | 0 | 0 | 0 | 0 | 0 | 0 | 0 | 0 | 0 | 0 | 0 |
|  | silicone derivative C | 0 | 0 | 0 | 0 | 0 | 0 | 0 | 0 | 10 | 0 | 10 | 10 | 10 | 10 |
|  | radical generator A | 2 | 2 | 2 | 2 | 2 | 2 | 2 | 2 | 2 | 2 | 2 | 2 | 2 | 2 |
|  | radical generator B | 0 | 0 | 0 | 0 | 0 | 0 | 0 | 0 | 0 | 0 | 0 | 0 | 0 | 0 |
| results | remaining film ratio after development | 97% | 65% | 70% | 90% | 95% | 95% | 95% | 95% | <10% | 13% | 40% | 99% | 75% | 99% |
|  | transparency | 92% | 95% | 91% | 95% | 97% | 97% | 97% | 97% | n/a | n/a | n/a | 91% | 93% | 90% |
|  | chemical resistance/acid | A | A | A | A | A | A | A | A | n/a | n/a | B | A | A | A |
|  | chemical resistance/base | C | C | B | C | C | C | C | C | n/a | n/a | C | A | C | A |
|  | resolution | C | A | B | A | A | A | A | A | n/a | n/a | A | C | A | C |

In Comparative examples 2 to 4, each film had a thickness of 2 μm and could not be developed with a 0.25% sodium carbonate aqueous solution and was hence developed with a 2.38% TMAH aqueous solution. The film was immersed in the developer for 30 seconds in Comparative example 2 or 60 seconds in Comparative examples 3 and 4. Although the films in Comparative examples 9 to 11 could be developed with a 0.25% sodium carbonate aqueous solution, it took long time to develop them. In view of that, they were immersed in a 0.4% TMAH developer for 60 seconds to obtain the results.

The "n/a" in the above table means that it was impossible to evaluate the aimed property.

Other remarks in the above tables are as follows:

radical generator B: "Irgacure 369" ([trademark], manufactured by BASF), silicone derivative B: "KR-510" ([trademark], manufactured by Shin-Etsu Chemical Co., Ltd.), silicone derivative C: "KR-513" ([trademark], manufactured by Shin-Etsu Chemical Co., Ltd.), and epoxy-containing compound: "TECHMORE VG3101" ([trademark], manufactured by Printec Corporation), which is represented by the following formula:

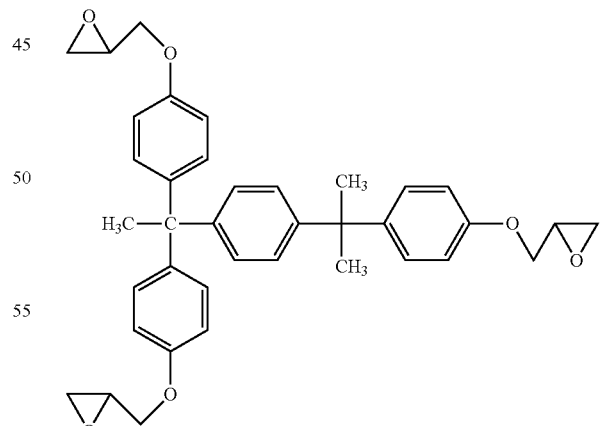

The properties were evaluated in the following manners.

Resolution

After the heating step (post-baking step), each pattern was observed with an optical microscope and thereby graded according the following criteria:

A: capable of forming contact-holes of 10 μm or less

B: capable of forming contact-holes of more than 10 μm but not more than 20 μm, and C: capable of forming contact-holes of more than 20 μm but not more than 50 μm.

Remaining Film Ratio after Development

The film thickness before and after development was observed with an optical microscope, and the difference ratio thereof was evaluated.

Transparency

The composition was spin-coated on a non-alkali glass plate, and then prebaked on a hot-plate at 100° C. for 90 seconds to form a film. The whole surface of the film was subjected to exposure at 50 mJ/cm² by means of i-line exposure system, subsequently immersed for 60 seconds in a 2.38% TMAH aqueous solution, thereafter rinsed with pure water for 30 seconds, and finally cured at 200° C. for 1 hour. The obtained film was controlled to have a thickness of 2.0 μm. The transparency of the resultant film was then measured at 400 nm with a UV spectrophotometer (U-4000).

Chemical Resistance (Acid)

The patterns were heated at 40° C., and then immersed in a PAN etchant solution (Al-Etchant [trademark], manufactured by Wako Pure Chemical Industries, Ltd.) for 3 minutes. Subsequently, film loss after immersion was measured.

A: within ±5%, and

B: out of the range of ±5%

Chemical Resistance (Base)

The patterns were heated at 60° C., and then immersed for 3 minutes in a stripping solution (TOK106 [trademark], manufactured by TOKYO OHKA KOGYO Co., Ltd.), which contains alkanolamine and dimethylsulfoxide. Subsequently, film loss after immersion was measured.

A: within ±5%,

B: out of the range of ±5% and within ±10%, and

C: out of the range of ±10% and within ±15%.

Independently of the above evaluation on chemical resistance (base), the patterns were heated at 80° C. and then immersed for 6 minutes in a stripping solution (TOK106 [trademark], manufactured by TOKYO OHKA KOGYO Co., Ltd.), which contains alkanolamine and dimethylsulfoxide. Subsequently, film loss after immersion was measured.

A: within ±5%,

B: out of the range of ±5% and within ±10%, and

C: out of the range of ±10% and within ±15%.

As a result, the samples of Examples 1 and 4 were graded as B while that of Example 5 was graded as A.

The invention claimed is:

1. A negative type photosensitive composition comprising:
    (I) an alkali-soluble resin which is a polymer comprising a carboxyl-containing polymerization unit and an alkoxysilyl-containing polymerization unit and also which has a solid content acid value of 40 to 190 mg KOH/g, and has a weight average molecular weight of 1,000 to 40,000,
    (II) a polysiloxane which is trialkoxysilane and/or a tetraalkoxysilane and in combination with a dialkoxysilane,
    (III) a compound having two or more (meth)acryloyloxy groups,
    (IV) a silicone oligomer represented by the following formula (A):

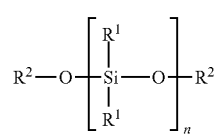

in which
    $R^1$ is methyl, phenyl epoxy or (meth)acrylic groups and
    $R^2$ is methyl or ethyl; and
    n is an integer of 2 to 20;
    (V) a polymerization initiator, and
    (VI) a solvent.

2. The composition according to claim 1, wherein said carboxyl-containing polymerization unit is derived from an unsaturated carboxylic acid, an unsaturated carboxylic anhydride, or a mixture thereof.

3. The composition according to claim 1, wherein said alkoxysilyl-containing polymerization unit is derived from a monomer represented by the following formula (B):

$$X^B\text{---}(CH_2)_2\text{---}Si(OR^B)_b(CH_3)_{3-b}$$

in which
    $X^B$ is a vinyl, styryl or (meth)acryloyl group;
    $R^B$ is methyl or ethyl group;
    a is an integer of 0 to 3; and
    b is an integer of 1 to 3.

4. The composition according to claim 1, wherein said polysiloxane has a weight average molecular weight of 700 to 5000.

5. The composition according to claim 1, which contains said silicone oligomer or said compound having two or more epoxy groups in an amount of 1 to 70 weight parts based on 100 weight parts in total of said alkali-soluble resin and said polysiloxane.

6. The composition according to claim 1, which contains said compound having two or more (meth)acryloyloxy groups in an amount of 3 to 80 weight parts based on 100 weight parts in total of said alkali-soluble resin and said polysiloxane.

7. The composition according to claim 1, wherein said polymerization initiator is a photo-radical generator.

8. A method for forming a cured film, comprising:
    coating a substrate with the composition according to claim 1, to form a coating film,
    exposing the coating film to light, and
    developing the exposed film.

9. The method for forming a cured film, according to claim 8; which further comprises the step of heating to cure the coating film at a temperature of 70 to 360° C. after the developing step.

10. The method according to claim 8, wherein a developer of a concentration of 0.05 to 1.5 wt % TMAH aqueous solution, 0.1 to 2.5 wt % sodium carbonate aqueous solution, or 0.01 to 1.5 wt % potassium hydroxide aqueous solution is used in the developing the exposed film.

11. A cured film formed from the composition according to claim 1.

12. A device comprising the cured film according to claim 11.

13. The composition according to claim 1, wherein said alkali-soluble resin has a weight average molecular weight of 2,000 to 30,000.

14. A negative type photosensitive composition comprising:
(I) an alkali-soluble resin which is a polymer comprising a carboxyl-containing polymerization unit and an alkoxysilyl-containing polymerization unit and also which has a solid content acid value of 40 to 190 mg KOH/g, and has a weight average molecular weight of 1,000 to 40,000,
(II) a polysiloxane,
(III) a compound having two or more (meth)acryloyloxy groups,
(IV) a silicone oligomer represented by the following formula (A):

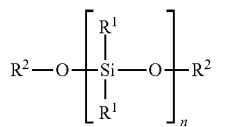

in which
R$^1$ is straight, branched or cyclic alkyl group having 1 to 20 carbon atoms, epoxy, (meth)acrylic group, mercapto group, hydroxyl group, an alkoxy group acetyl group and isocyanurate groups,
R$^2$ is a group selected from the group consisting of a straight, branched or cyclic alkyl group having 1 to 20 carbon atoms, an aryl group having 6 to 20 carbon atoms, epoxy group, (meth)acrylic group, mercapto group, carboxyl group, hydroxyl group, an alkoxy group, and isocyanurate group; provided that said alkyl or aryl group may be substituted with a group selected from the group consisting of epoxy group, (meth) acrylic group, mercapto group, carboxyl group, hydroxyl group, an alkoxy group, and isocyanurate group; and
n is an integer of 2 to 20;
(V) a polymerization initiator, and
(VI) a solvent.
15. The composition according to claim 14, wherein said polysiloxane has a weight average molecular weight of 700 to 5000.
16. The composition according to claim 14, which contains said silicone oligomer or said compound having two or more epoxy groups in an amount of 1 to 70 weight parts based on 100 weight parts in total of said alkali-soluble resin and said polysiloxane.
17. The composition according to claim 14, which contains said compound having two or more (meth)acryloyloxy groups in an amount of 3 to 80 weight parts based on 100 weight parts in total of said alkali-soluble resin and said polysiloxane.
18. The composition according to claim 14, wherein said polymerization initiator is a photo-radical generator.
19. A method for forming a cured film, comprising:
coating a substrate with the composition according to claim 14, to form a coating film,
exposing the coating film to light, and
developing the exposed film.
20. The method for forming a cured film, according to claim 19, which further comprises the step of heating to cure the coating film at a temperature of 70 to 360° C. after the developing step.
21. The method according to claim 19, wherein a developer of a concentration of 0.05 to 1.5 wt % TMAH aqueous solution, 0.1 to 2.5 wt % sodium carbonate aqueous solution, or 0.01 to 1.5 wt % potassium hydroxide aqueous solution is used in the developing the exposed film.
22. A cured film formed from the composition according to claim 14.
23. A device comprising the cured film according to claim 22.
24. The composition according to claim 14, wherein R$^1$ is methyl, ethyl, epoxy, (meth)acrylic, mercapto, hydroxyl, acetyl, or isocyanurate groups.
25. The composition according to claim 14, wherein R$^1$ is methyl, phenyl epoxy or (meth)acrylic groups and R$^2$ is methyl or ethyl.
26. The composition according to claim 14, wherein said alkali-soluble resin has a weight average molecular weight of 2,000 to 30,000.
27. The composition according to claim 14, wherein said silicone oligomer has a weight average molecular weight of 10,000 or less.
28. The composition according to claim 14, wherein the component (IV) further comprises a compound having two or more epoxy groups and selected from the group consisting of the formula (C) and formula (D)

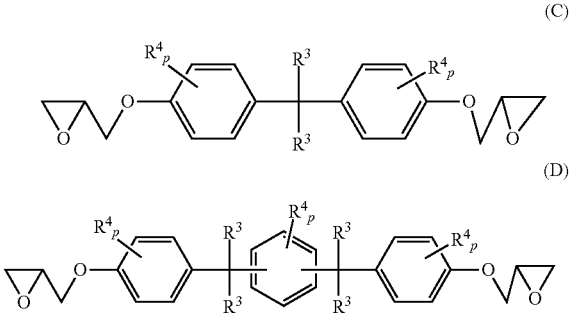

wherein
each R3 is independently an alkyl group, an aryl group, carboxy group, a fluorinated alkyl group, a carboxyalkyl group, a glycidyloxyaryl group, a glycidyloxyarylalkyl group or a glycidyloxyarylalkylaryl group, provided that two R3s connecting to the same carbon atom may link to each other to form a cycloalkyl or condensed multicyclic hydrocarbon ring;
each R4 is independently a glycidyloxyarylalkyl group or an alkyl group; and
p is an integer of 0 to 4.
29. The composition according to claim 28, wherein each R$^3$ is independently an alkyl group of 1 to 8 carbon atoms, an aryl group of 6 to 10 carbon atoms, carboxy group, a fluorinated alkyl group of 1 to 3 carbon atoms, a carboxyalkyl group of 2 to 4 carbon atoms, a glycidyloxyaryl group of 6 to 13 carbon atoms, a glycidyloxyarylalkyl group of 9 to 15 carbon atoms, or glycidyloxyarylalkylaryl group of 15 to 25 carbon atoms, or
in the case where R$^3$s form a cycloalkyl ring, the ring contains 6 to 8 carbon atoms and if the ring is a condensed multicyclic hydrocarbon ring, the ring contains 10 to 15 carbon atoms;
each R$^4$ is independently a glycidyloxyarylalkyl group of 9 to 13 carbon atoms or an alkyl group of 1 to 8 carbon atoms and
p is an integer of 0 to 2.

30. A negative type photosensitive composition comprising:
- (I) an alkali-soluble resin which is a polymer comprising a carboxyl-containing polymerization unit and an alkoxysilyl-containing polymerization unit and also which has a solid content acid value of 40 to 190 mg KOH/g, and has a weight average molecular weight of 1,000 to 40,000,
- (II) a polysiloxane,
- (III) a compound having two or more (meth)acryloyloxy groups,
- (IV) a silicone oligomer represented by the following formula (A):

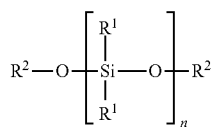
(A)

in which
R$^1$ is independently a group selected from the group consisting of a straight, branched or cyclic alkyl group having 1 to 20 carbon atoms, epoxy group, (meth) acrylic group, mercapto group, hydroxyl group, and isocyanurate group; provided that said aryl group may be substituted with a group selected from the group consisting of epoxy group, (meth)acrylic group, mercapto group, carboxyl group, hydroxyl group, and isocyanurate group or said alkyl group may be substituted with a group selected from the group consisting of epoxy group, (meth)acrylic group, mercapto group, carboxyl group, and isocyanurate group;
R$^2$ is a group selected from the group consisting of a straight, branched or cyclic alkyl group having 1 to 20 carbon atoms, an aryl group having 6 to 20 carbon atoms, epoxy group, (meth)acrylic group, mercapto group, carboxyl group, hydroxyl group, an alkoxy group, and isocyanurate group; provided that said alkyl or aryl group may be substituted with a group selected from the group consisting of epoxy group, (meth) acrylic group, mercapto group, carboxyl group, hydroxyl group, an alkoxy group, and isocyanurate group; and
n is an integer of 2 to 20;
- (V) a polymerization initiator, and
- (VI) a solvent.

31. The composition according to claim 30, wherein the component (IV) further comprises a compound having two or more epoxy groups and selected from the group consisting of the formula (C) and formula (D)

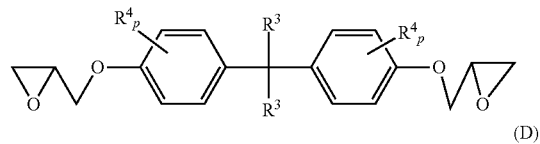
(C)

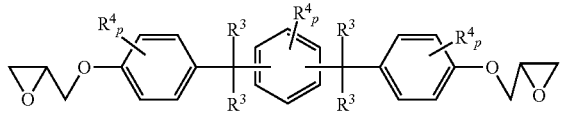
(D)

wherein
each R3 is independently an alkyl group, an aryl group, carboxy group, a fluorinated alkyl group, a carboxyalkyl group, a glycidyloxyaryl group, a glycidyloxyarylalkyl group or a glycidyloxyarylalkylaryl group, provided that two R3s connecting to the same carbon atom may link to each other to form a cycloalkyl or condensed multicyclic hydrocarbon ring;
each R4 is independently a glycidyloxyarylalkyl group or an alkyl group; and
p is an integer of 0 to 4.

32. The composition according to claim 31, wherein each R$^3$ is independently an alkyl group of 1 to 8 carbon atoms, an aryl group of 6 to 10 carbon atoms, carboxy group, a fluorinated alkyl group of 1 to 3 carbon atoms, a carboxyalkyl group of 2 to 4 carbon atoms, a glycidyloxyaryl group of 6 to 13 carbon atoms, a glycidyloxyarylalkyl group of 9 to 15 carbon atoms, or glycidyloxyarylalkylaryl group of 15 to 25 carbon atoms, or
in the case where les form a cycloalkyl ring, the ring contains 6 to 8 carbon atoms and if the ring is a condensed multicyclic hydrocarbon ring, the ring contains 10 to 15 carbon atoms;
each R$^4$ is independently a glycidyloxyarylalkyl group of 9 to 13 carbon atoms or an alkyl group of 1 to 8 carbon atoms and
p is an integer of 0 to 2.

* * * * *